(12) United States Patent
Won et al.

(10) Patent No.: US 11,959,003 B2
(45) Date of Patent: *Apr. 16, 2024

(54) QUANTUM DOTS, A COMPOSITION OR COMPOSITE INCLUDING THE SAME, AND AN ELECTRONIC DEVICE INCLUDING THE SAME

(71) Applicant: Samsung Display Co., Ltd., Yongin-si (KR)

(72) Inventors: Nayoun Won, Suwon-si (KR); Garam Park, Seoul (KR); Shin Ae Jun, Seongnam-si (KR); Tae Gon Kim, Hwaseong-si (KR); Taekhoon Kim, Hwaseong-si (KR); Shang Hyeun Park, Yongin-si (KR); Mi Hye Lim, Suwon-si (KR)

(73) Assignee: SAMSUNG DISPLAY CO., LTD, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/108,708

(22) Filed: Feb. 13, 2023

(65) Prior Publication Data
US 2023/0193131 A1 Jun. 22, 2023

Related U.S. Application Data

(63) Continuation of application No. 16/918,316, filed on Jul. 1, 2020, now Pat. No. 11,613,699.

(30) Foreign Application Priority Data

Jul. 10, 2019 (KR) ......... 10-2019-0083503

(51) Int. Cl.
| | | |
|---|---|---|
| *C09K 11/88* | (2006.01) | |
| *C09D 4/06* | (2006.01) | |
| *C09D 5/22* | (2006.01) | |
| *C09D 7/45* | (2018.01) | |
| *C09D 7/65* | (2018.01) | |
| *C09D 135/02* | (2006.01) | |
| *C09K 11/02* | (2006.01) | |
| *C09K 11/08* | (2006.01) | |
| *B82Y 20/00* | (2011.01) | |
| *B82Y 40/00* | (2011.01) | |
| *H10K 50/115* | (2023.01) | |
| *H10K 59/38* | (2023.01) | |

(52) U.S. Cl.
CPC ............ *C09K 11/883* (2013.01); *C09D 4/06* (2013.01); *C09D 5/22* (2013.01); *C09D 7/45* (2018.01); *C09D 7/65* (2018.01); *C09D 135/02* (2013.01); *C09K 11/02* (2013.01); *C09K 11/0883* (2013.01); *B82Y 20/00* (2013.01); *B82Y 40/00* (2013.01); *H10K 50/115* (2023.02); *H10K 59/38* (2023.02)

(58) Field of Classification Search
CPC ... C09K 11/883; C09K 11/02; C09K 11/0883; C09K 11/70; C09K 11/562; C09K 11/88; C09D 4/06; C09D 5/22; C09D 7/45; C09D 7/65; C09D 135/02; B82Y 20/00; B82Y 40/00; B82Y 30/00; H10K 50/115; H10K 59/38; H10K 71/00; H10K 2102/331; C08F 265/06

See application file for complete search history.

(56) References Cited

U.S. PATENT DOCUMENTS

| | | | |
|---|---|---|---|
| 10,170,648 B2 * | 1/2019 | Jun ................. | H01L 31/0296 |
| 10,294,421 B2 | 5/2019 | Fan et al. | |
| 11,613,699 B2 * | 3/2023 | Won ................. | C09K 11/0883 |
| | | | 257/40 |
| 2018/0033856 A1 * | 2/2018 | Kwon ............... | C09K 11/70 |
| 2019/0140113 A1 | 5/2019 | Jun et al. | |

FOREIGN PATENT DOCUMENTS

| | | |
|---|---|---|
| JP | 2018041960 A | 3/2018 |
| KR | 101537296 B1 | 7/2015 |

OTHER PUBLICATIONS

Ajit Vikram et al., "A Millifluidic Reactor System for Multistep Continuous Synthesis of InP/ZnSeS Nanoparticles," Quantum Dots, Jul. 19, 2018, pp. 943-953, vol. 4.
Jaehoon Lim et al., "InP@ZnSeS, Core@Composition Gradient Shell Quantum Dots with Enhanced Stability," Chemistry of Materials, Sep. 30, 2011, pp. 4459-4463, vol. 23.
Mickael D. Tessier et al., "Economic and Size-Tunable Synthesis of InP/ZnE (E = S, Se) Colloidal Quantum Dots," Chemistry of Materials, Jun. 11, 2015, pp. 4893-4898, vol. 27.
Louis Biadala et al., "Band-Edge Exciton Fine Structure and Recombination Dynamics in InP/ZnS Colloidal Nanocrystals," ACS Nano, Feb. 18, 2016, pp. 3356-3364, vol. 10.
Jaehoon Lim et al., "Highly Efficient Cadmium-Free Quantum Dot Light-Emitting Diodes Enabled by the Direct Formation of Excitons within InP@ZnSeS Quantum Dots," ACS Nano, 2013, pp. 9019-9026, vol. 7, Issue 10.

* cited by examiner

*Primary Examiner* — Donald L Raleigh
(74) *Attorney, Agent, or Firm* — CANTOR COLBURN LLP

(57) ABSTRACT

A quantum dot including a core including a semiconductor nanocrystal including a Group III-V compound; and a first semiconductor nanocrystal shell disposed on the semiconductor nanocrystal core, the first semiconductor nanocrystal shell including zinc, selenium, and optionally sulfur, and a second semiconductor nanocrystal shell disposed on the first semiconductor nanocrystal shell, the second semiconductor nanocrystal shell including zinc, sulfur, and optionally selenium, wherein the quantum dot does not include cadmium, an emission peak wavelength of the quantum dot is in a range of about 500 nanometers (nm) to about 550 nm, and an ultraviolet-visible absorption spectrum of the quantum dot includes a first exciton absorption peak and a second exciton absorption peak, a composition including the same, a composite, and an electronic device.

25 Claims, 9 Drawing Sheets

QUANTUM DOTS, A COMPOSITION OR COMPOSITE INCLUDING THE SAME, AND AN ELECTRONIC DEVICE INCLUDING THE SAME

CROSS-REFERENCE TO RELATED APPLICATION

This application is a continuation application of application Ser. No. 16/918,316, filed Jul. 1, 2020, which claims priority to and the benefit of Korean Patent Application No. 10-2019-0083503 filed in the Korean Intellectual Property Office on Jul. 10, 2019, and all the benefits accruing therefrom under 35 U.S.C. § 119, the content of which in its entirety is herein incorporated by reference.

BACKGROUND

1. Field

Quantum dots, a composition or a composite including the same, and an electronic device including the same are disclosed.

2. Description of the Related Art

Quantum dots (i.e., nano-sized semiconductor nanocrystals) may have different bandgap energies by controlling sizes and compositions of nanocrystals, unlike bulk materials. Quantum dots may exhibit electroluminescence and photoluminescence properties. In a chemical wet process, organic materials such as dispersing agents are coordinated on, e.g., bound to, the surface of the semiconductor nanocrystal during a crystal growth to provide quantum dots having controlled sizes and photoluminescence characteristics. Light emitting properties of quantum dots may be applied, e.g., used, in various fields. From an environmental perspective, it is desirable to develop cadmium-free quantum dots capable of realizing, e.g., exhibiting, improved light emitting properties.

SUMMARY

An embodiment provides a cadmium-free quantum dot including a Group III-V core having a stable structure and thus improved luminous efficiency.

An embodiment provides a composition including the cadmium-free quantum dot.

An embodiment provides a quantum dot-polymer composite including the cadmium-free quantum dot.

An embodiment provides a stacked structure and an electronic device including the quantum dot-polymer composite.

In an embodiment, a cadmium-free quantum dot includes
a semiconductor nanocrystal core including a Group III-V compound, and
a first semiconductor nanocrystal shell disposed on the semiconductor nanocrystal core, the first semiconductor nanocrystal shell including zinc, selenium, and optionally sulfur and a second semiconductor nanocrystal shell disposed on the first semiconductor nanocrystal shell, the second semiconductor nanocrystal shell including zinc, sulfur, and optionally selenium,
wherein the quantum dot does not include cadmium,
an emission peak wavelength of the quantum dot is in a range of about 500 nanometers (nm) to about 550 nm, and
an ultraviolet-visible absorption spectrum of the quantum dot comprises a first exciton absorption peak ($1^{st}$ absorption peak) and a second exciton absorption peak ($2^{nd}$ absorption peak).

An absolute value of a second derivative of the second exciton absorption peak may be greater than or equal to about 0.001.

A difference between an energy of the first exciton absorption peak and an energy of the second exciton absorption peak may be greater than or equal to about 0.34 electronvolts (eV).

A difference between an energy of the first exciton absorption peak and an energy of the second exciton absorption peak may be greater than or equal to about 0.35 eV.

A difference between an energy of the first exciton absorption peak and an energy of the second exciton absorption peak may be less than or equal to about 0.5 eV.

A difference between an energy of the first exciton absorption peak and an energy of the second exciton absorption peak may be less than or equal to about 0.45 eV.

The ultraviolet-visible absorption spectrum of the quantum dot may further include a third exciton absorption peak ($3^{rd}$ absorption peak).

A difference between an energy of the first exciton absorption peak and an energy of the third exciton absorption peak may be greater than or equal to about 0.55 eV.

A percentage of a number of moles of sulfur relative to a total number of moles of sulfur and selenium in the first semiconductor nanocrystal shell may be less than or equal to about 10%.

A percentage of a number of moles of sulfur relative to a total number of moles of sulfur and selenium in the first semiconductor nanocrystal shell may be greater than about 0% and less than or equal to about 10%.

A percentage of a number of moles of sulfur relative to a total number of moles of sulfur and selenium in the second semiconductor nanocrystal shell may be about 80% to about 100%.

The semiconductor nanocrystal core may include indium and phosphorus.

The semiconductor nanocrystal core may further include zinc.

The quantum dot may have quantum efficiency of greater than or equal to about 80%.

The quantum dot may have a full width at half maximum (FWHM) of a photoluminescence peak of less than or equal to about 50 nm.

The quantum dot may include RCOOH, RCOOCOR, $RNH_2$, $R_2NH$, $R_3N$, RSH, $R_3PO$, $R_3P$, ROH, RCOOR', $RPO(OH)_2$, $R_2POOH$ (wherein, R and R' are independently a substituted or unsubstituted C1 to C30 aliphatic hydrocarbon group, a substituted or unsubstituted C6 to C30 aromatic hydrocarbon group, or a combination thereof), or a combination thereof on the surface.

A composition for producing a quantum dot-polymer composite according to an embodiment includes the quantum dot according to an embodiment, a dispersing agent, a polymerizable monomer including a carbon-carbon unsaturated bond, and an initiator.

The dispersing agent may be a polymer including a carboxylic acid group, and
the polymer may include
a copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain, the multiple aromatic ring-containing polymer including a carboxylic acid group (—COOH); or a combination thereof.

The composition may further include a multiple thiol compound having at least two thiol groups at a terminal end thereof, metal oxide particulates, or a combination thereof.

The metal oxide particulates may include $TiO_2$, $SiO_2$, $BaTiO_3$, $Ba_2TiO_4$, ZnO, or a combination thereof.

The thiol compound may include a compound represented by Chemical Formula 6:

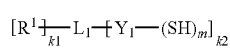

Chemical Formula 6

In Chemical Formula 6, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; hydroxy group; —$NH_2$; a substituted or unsubstituted C1 to C30 amine group (—NRR', wherein R and R' are independently hydrogen or a C1 to C30 linear or branched alkyl group and are not hydrogen simultaneously); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted alkylene group and X is a halogen); —C(=O)OR' (wherein R' is hydrogen or a C1 to C20 linear or branched alkyl group); —CN; —C(=O)ORR' or —C(=O)ONRR' (wherein R and R' are independently hydrogen or a C1 to C20 linear or branched alkyl group), $L_1$ is a carbon atom, a substituted or unsubstituted C1 to C30 alkylene group, a substituted or unsubstituted C1 to C30 alkylene group in which at least one methylene (—$CH_2$—) is replaced by sulfonyl (—$SO_2$—), carbonyl (CO), ether (—O—), sulfide (—S—), sulfoxide (—SO—), ester (—C(=O)O—), an amide (—C(=O)NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene moiety, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group in which at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), an amide (—C(=O)NR—) (wherein R is hydrogen or a C1 to C10 linear or branched alkyl group), an imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, m does not exceed the valence of $Y_1$, and the sum of k1 and k2 does not exceed the valence of $L_1$.

A quantum dot-polymer composite according to an embodiment includes a polymer matrix and the quantum dot according to an embodiment in the polymer matrix, wherein the polymer matrix includes a binder polymer, a polymerization product of a photopolymerizable monomer having at least one carbon-carbon double bond, and optionally a polymerization product of the photopolymerizable monomer and a multiple thiol compound having at least two thiol groups at a terminal end thereof.

The quantum dot-polymer composite which is heat-treated at 180° C. for 30 minutes under a nitrogen atmosphere may have photo-conversion efficiency (CE) of greater than or equal to about 30%.

A display device according to an embodiment includes a light source and a light emitting element, wherein the light emitting element includes the quantum dot-polymer composite according to an embodiment, and the light source is configured to provide the light emitting element with incident light.

The incident light may have an emission peak wavelength of about 440 nm to about 460 nm.

The quantum dot according to an embodiment has improved quantum efficiency due to a more stabilized structure, and the composition including the quantum dot according to the embodiment may provide improved light emitting characteristics. The quantum dot may be applied to, e.g., used in, various display devices and biological labeling (e.g., bio sensor or bio imaging, etc.), a photo detector, a solar cell, a hybrid composite, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
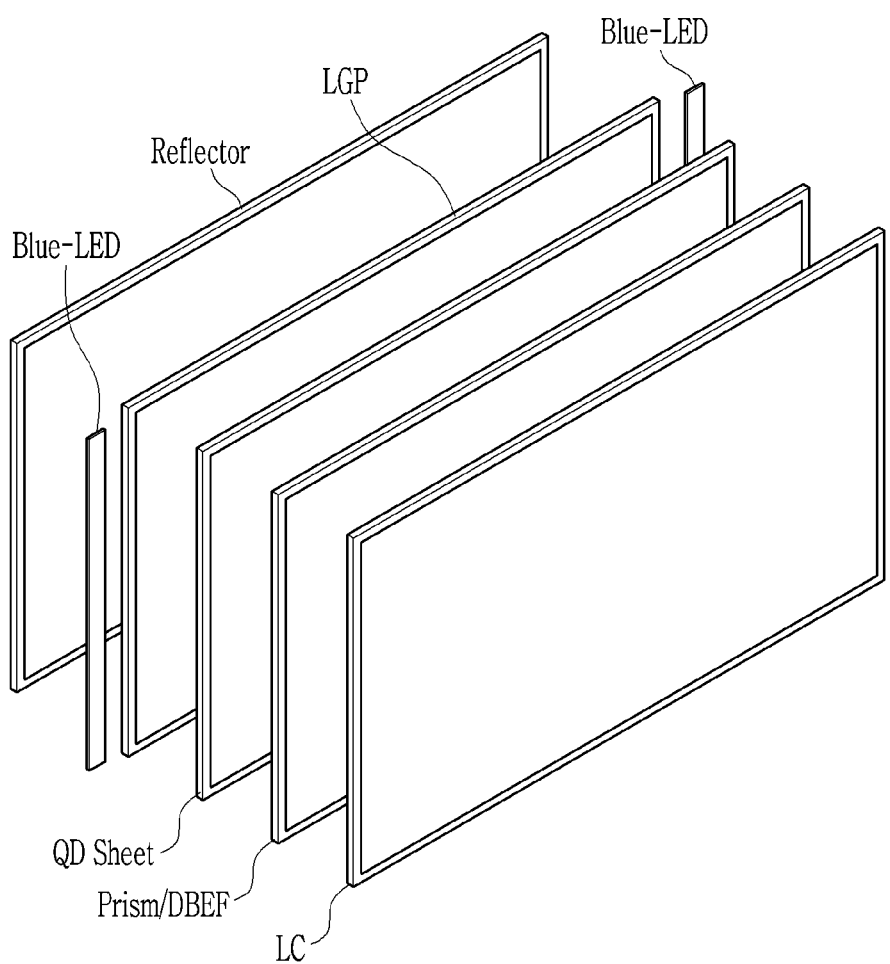
FIG. 1 is an exploded view of a display device according to an embodiment.

Advantages and characteristics of this disclosure, and a method for achieving the same, will become evident referring to the following embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$N$_2$, wherein M is an organic or inorganic cation), or a combination thereof.

As used herein, when a definition is not otherwise provided, the term "hetero" may refer to inclusion of at least one to three heteroatoms of N, O, S, Si, or P.

As used herein, when a definition is not otherwise provided, "alkylene" refers to a straight or branched saturated aliphatic hydrocarbon group having at least two valences and optionally substituted with at least one substituent. As used herein, "arylene group" refers to a functional group having at least two valences obtained by removal of at least two hydrogens in at least one aromatic ring, and optionally substituted with at least one substituent.

As used herein, when a definition is not otherwise provided, "aliphatic hydrocarbon" refers to a C1 to C30 linear or branched alkyl group, "aromatic" may refer to a C6 to C30 aryl group or a C2 to C30 heteroaryl group, and "alicyclic hydrocarbon group" may refer to a C3 to C30 cycloalkyl group, a C3 to C30 cycloalkenyl group, or a C3 to C30 cycloalkynyl group.

As used herein, when a definition is not otherwise provided, "(meth)acrylate" refers to acrylate, methacrylate, or a combination thereof.

As used herein, when a definition is not otherwise provided, "hydrophobic moiety" refers a moiety providing the corresponding compound with a tendency to be agglomerated in an aqueous solution and to repel water. For example, the hydrophobic moiety may include an aliphatic hydrocarbon group having a carbon number of two (2) or greater (alkyl, alkenyl, alkynyl, etc.), an aromatic hydrocarbon group having a carbon number of six (6) or greater (phenyl, naphthyl, aralkyl group, etc.), or an alicyclic hydrocarbon group having a carbon number of five (5) or greater (cyclohexyl, norbornene, norbornane, tricyclodecane, etc.). In an embodiment, the hydrophobic moiety is not mixed with the ambient medium since the hydrophobic moiety may substantially lack capability of making a hydrogen bond with the ambient medium, or since the polarity thereof is not matched therewith.

As used herein, "visible light" refers to light having a wavelength of for example about 390 nm to about 700 nm. As used herein, "UV" refers to light having a wavelength of for example greater than or equal to about 200 nm and less than about 390 nm.

As used herein, "photo-conversion efficiency" refers to a percentage of a light emission amount of the quantum dot composite relative to absorbed light amount of the quantum dot-polymer composite from excitation light (for example, blue light). The total light amount (B) of excitation light is obtained by integrating a PL spectrum, the PL (photoluminescence) spectrum of the quantum dot composite film is measured, a light amount (A) in a green or red wavelength emitted from the quantum dot composite film and a light amount (B') of excitation light are obtained, and the photo-conversion efficiency is obtained by the following equation:

$$A/(B-B') \times 100 = \text{photo-conversion efficiency (\%)}$$

As used herein, "dispersion" refers to dispersion wherein a dispersed phase is a solid and a continuous phase includes a liquid. For example, "dispersion" refers to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

As used herein, "Group" refers to a group of Periodic Table.

As used herein, "Group I" refers to Group IA and Group IB, and examples may include Li, Na, K, Ru, and Cs, but are not limited thereto.

As used herein, "Group II" refers to Group IIA and Group IIB, and examples of Group metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

Semiconductor nanocrystal particles that are also referred to as "quantum dots" are nano-sized crystalline semiconductor materials. Quantum dots may have a large surface area per unit volume, may exhibit a quantum confinement effect, and may exhibit different properties from those of bulk materials of the same composition. Quantum dots may absorb light from an excitation source and may become excited, and may emit energy corresponding to bandgap energies of the quantum dots.

Quantum dots have a potential to be applied, e.g., used, in various devices (e.g., electronic devices) due to unique light emitting characteristics of the quantum dots. Quantum dots having properties applicable to, e.g., useful in, electronic devices may be cadmium based quantum dots. However, cadmium may raise environmental and health issues and is a regulated element. Examples of cadmium-free quantum dots may be a Group III-V based nanocrystal. However, cadmium-free quantum dots may have poor stability (e.g., chemical stability and thermal stability) compared with cadmium based quantum dots. When cadmium-free quantum dots are subjected to various processes for application to, e.g., use in, electronic devices, the cadmium-free quantum dots may exhibit significantly degraded light emitting properties.

A cadmium-free quantum dot according to an embodiment (hereinafter, also referred to as a quantum dot) does not include cadmium. The quantum dot includes a core including a semiconductor nanocrystal including a Group III-V compound, and a first semiconductor nanocrystal shell disposed on the semiconductor nanocrystal core and including zinc, selenium, and optionally sulfur, and a second semiconductor nanocrystal shell disposed on the first semiconductor nanocrystal shell and including zinc, sulfur, and optionally selenium, wherein an emission peak wavelength is in a range of about 500 nm to about 550 nm, and two peaks of a first exciton absorption peak ($1^{st}$ absorption peak) and a second exciton absorption peak ($2^{nd}$ absorption peak) are exhibited in the UV-Vis absorption spectrum of the quantum dot. The cadmium-free quantum dot has very high quantum efficiency (quantum yield) of greater than or equal to about 80%, and the full width at half maximum (FWHM) of the photoluminescence peak of less than or equal to about 50 nm. That is, the cadmium-free quantum dot according to an embodiment has very high quantum efficiency and color purity and is a quantum dot capable of emitting green light.

In the UV-Vis absorption spectrum of the quantum dot, the first exciton absorption peak having first peak energy and the second exciton absorption peak having second peak energy are exhibited. A quantum dot including the semiconductor nanocrystal including the Group III-V compound in the core, having the photoluminescence peak wavelength in a range of about 500 nm to 550 nm, and exhibiting two separated first exciton absorption peak and second exciton absorption peak in the UV-Vis absorption spectrum is provided. The two peaks appearing separately in the UV-Vis absorption spectrum indicate that the corresponding quantum dot is structurally uniform and stable. In order for a quantum dot to be structurally uniform or stable, the size or shape of the core of the quantum dot may be uniform, the semiconductor nanocrystal shell may be uniformly and stably disposed on the core, a band offset difference of energy bands between the core and the shell maybe large, a lattice mismatch of the bandgap energies maybe low, or a combination thereof. As such, the quantum dot of the stable structure may exhibit high quantum efficiency, high color purity, or a combination thereof.

An energy difference between the first exciton absorption peak and the second exciton absorption peak of the quantum dot, e.g., a different in an energy between the first exciton absorption peak of the quantum dot and an energy of the second exciton absorption peak of the quantum dot, according to an embodiment may be greater than or equal to about 0.34 eV. When the energy difference between the two peaks is greater than or equal to about 0.34 eV, the corresponding quantum dot has a stable structure, and thus appears to exhibit high quantum efficiency. For example, the peak energy difference between the first exciton absorption peak and the second exciton absorption peak may be greater than or equal to about 0.35 eV, for example, greater than or equal to about 0.36 eV, greater than or equal to about 0.37 eV, greater than or equal to about 0.38 eV, or greater than or equal to about 0.39 eV, but is not limited thereto. In addition, the peak energy difference between the first exciton absorption peak and the second exciton absorption peak may be less than or equal to about 0.5 eV, for example, less than or equal to about 0.48 eV, less than or equal to about 0.47 eV, greater than or equal to about 0.46 eV, less than or equal to about 0.45 eV, less than or equal to about 0.43 eV, or less than or equal to about 0.40 eV, but is not limited thereto. When the peak energy difference between the first exciton absorption peak and the second exciton absorption peak is within the disclosed ranges, the quantum dot may have quantum efficiency of greater than or equal to about 80%, for example greater than or equal to about 85%, greater than or equal to about 87%, greater than or equal to about 88%, greater than or equal to about 90%, greater than or equal to about 91%, greater than or equal to about 92%, greater than or equal to about 93%, greater than or equal to about 94%, greater than or equal to about 95%, greater than or equal to about 96%, greater than or equal to about 97%, greater than or equal to about 98%, or greater than or equal to about 99%, but is not limited thereto. In addition, as will be described later, when the peak energy difference of the first exciton absorption peak and the second exciton absorption peak is in the disclosed ranges, the photo-conversion efficiency (CE) after the post-baking of the quantum dot-polymer composite film including the quantum dot may be greater than or equal to about 33%.

Meanwhile, the absolute value of the second derivative of the first exciton absorption peak energy may be greater than or equal to about 0.001. In addition, the absolute value of the second derivative of the second exciton absorption peak energy may be greater than or equal to about 0.001. In the UV-Vis absorption spectrum, the first exciton absorption peak of the quantum dot may be more clearly distinguished than the second exciton absorption peak, e.g., the second exciton absorption peak may be small compared with the first exciton absorption peak, and the second exciton absorption peak may be difficult to distinguish clearly. Therefore, the UV-Vis absorption peak itself may be transformed into a second derivative of the absorption peak with respect to photon energy, and in this case, the presence and size of each peak may be more clearly determined. Accordingly, the first exciton absorption peak and the second exciton absorption peak may be represented as second derivatives, respectively, in the quantum dot according to an embodiment, and the absolute value of the second derivative of the second exciton absorption peak may be greater than or equal to about 0.001. As the absolute value of the second derivative of the second exciton absorption peak is greater than or equal to the value, the quantum dot according to an embodiment may have a stable structure and high quantum efficiency.

The quantum dot may further exhibit a third exciton absorption peak ($3^{rd}$ absorption peak) in the UV-Vis absorption spectrum. Herein, the energy difference between the first exciton absorption peak and the third exciton absorption peak may be greater than or equal to about 0.55 eV. For example, the energy difference between the first exciton absorption peak and the third exciton absorption peak may be greater than or equal to about 0.57 eV, for example greater than or equal to about 0.60 eV, greater than or equal to about 0.61 eV, greater than or equal to about 0.62 eV, greater than or equal to about 0.63 eV, or greater than or equal to about 0.65 eV, and less than or equal to about 0.75 eV, for example less than or equal to about 0.72 eV, or less than or equal to about 0.70 eV, but is not limited thereto. As the energy difference between the first exciton absorption peak and the third exciton absorption peak is greater than or equal to about 0.55 eV, it the quantum dot according to an embodiment may be structurally more stable due to a large band offset difference of an energy band between the core and shell.

As described above, the quantum dot according to an embodiment includes a core including a first semiconductor nanocrystal including a Group III-V compound, is a cadmium-free quantum dot that does not include cadmium. In the quantum dot, as a shell for structurally stabilizing the core, a first semiconductor nanocrystal shell including a semiconductor nanocrystal including zinc, selenium, and optionally sulfur may be disposed directly on the semiconductor nanocrystal core. By disposing the first semiconductor nanocrystal shell including a semiconductor nanocrystal including zinc, selenium, and optionally sulfur and having a band offset difference with the core on a uniformly synthesized core, the quantum dots produced therefrom are structurally stabilized and accordingly shows two separate peaks in the UV-Vis absorption spectrum and increased quantum efficiency.

The quantum dot includes an additional semiconductor nanocrystal shell, that is, a second semiconductor nanocrystal shell disposed on the first semiconductor nanocrystal shell. The second semiconductor nanocrystal shell disposed on the first semiconductor nanocrystal shell may include a semiconductor nanocrystal having a composition different from that of the first semiconductor nanocrystal shell.

In an embodiment, a percentage of the mole number, e.g., number of moles, of sulfur relative to the total mole number of selenium and sulfur, that is, S/(Se+S)×100% in the first semiconductor nanocrystal shell may be less than or equal to about 10%, that is, about 0% to about 10%. When the semiconductor nanocrystal of the first semiconductor nanocrystal shell formed directly on the semiconductor nanocrystal core of the quantum dot includes zinc, selenium, and optionally sulfur and the percentage of the mole number of sulfur relative to the total mole number of selenium and sulfur is within a range of less than or equal to about 10%, the offset of the energy band between the core and the shell increases, the structure of the shell surrounding the core becomes more uniform, and accordingly the produced quantum dot is considered to be more structurally stable. For example, when the percentage of the S/(Se+S)×100% in the first semiconductor nanocrystal shell is outside the disclosed range, for example, when the percentage exceeds 10%, uniformity of the first semiconductor nanocrystal shell may decrease, a full width at half maximum (FWHM) of the emission peak of the quantum dot may be increased, photoelectric conversion efficiency of a single layer including the quantum dot may be reduced, or a combination thereof, or there may not be an increase in photoelectric conversion efficiency with increasing ratio.

In an embodiment, the percentage of the mole number of sulfur relative to the total mole number of sulfur and selenium in the first semiconductor nanocrystal shell may be greater than about 0 mole percent (mol %) and less than or equal to about 10 mol %. When sulfur is included together with zinc and selenium in the first semiconductor nanocrystal shell, the luminous efficiency of the quantum dot may be further increased to greater than about 90% or the photoconversion efficiency (CE) of the quantum dot-polymer composite film including the quantum dot may be further increased. In other words, when sulfur is included in the first semiconductor nanocrystal shell together with zinc and selenium, the offset of the energy band between the core and the shell of the quantum dot becomes larger, and the structure of the shell surrounding the core becomes more uniform, and the produced quantum dot may be more structurally stable. Therefore, in an embodiment, the percentage of the mole number of sulfur relative to the total mole number of sulfur and selenium in the first semiconductor nanocrystal shell may be greater than or equal to about 1 mol %, greater than or equal to about 1.5 mol %, greater than or equal to about 2 mol %, greater than or equal to about 2.5 mol %, greater than or equal to about 3 mol %, greater than or equal to about 3.5 mol %, greater than or equal to about 4 mol %, greater than or equal to about 4.5 mol %, greater than or equal to about 5 mol %, greater than or equal to about 5.5 mol %, greater than or equal to about 6 mol %, greater than or equal to about 6.5 mol %, greater than or equal to about 7 mol %, greater than or equal to about 7.5 mol %, greater than or equal to about 8 mol %, greater than or equal to about 8.5 mol %, greater than or equal to about 9 mol %, or greater than or equal to about 9.5 mol %, but is not limited thereto. In addition, the percentage of the mole number of sulfur relative to the total mole number of sulfur and selenium in the first semiconductor nanocrystal shell may be less than or equal to about 10 mol %, less than or equal to about 9.5 mol %, less than or equal to about 9 mol %, less than or equal to about 8.5 mol %, less than or equal to about 8 mol %, less than or equal to about 7.5 mol %, less than or equal to about 7 mol %, less than or equal to about 6.5 mol %, less than or equal to about 6 mol %, less than or equal to about 5.5 mol %, less than or equal to about 5 mol %, less than or equal to about 4.5 mol %, less than or equal to about 4 mol %, less than or equal to about 3.5 mol %, less than or equal to about 3 mol %, less than or equal to about 2.5 mol %, less than or equal to about 2 mol %, less than or equal to about 1.5 mol %, or less than or equal to about 1 mol %, but is not limited thereto.

In addition, a percentage of the mole number of sulfur relative to the total mole number of selenium and sulfur in the second semiconductor nanocrystal shell disposed on the first semiconductor nanocrystal shell may be about 80% to about 100%. When the percentage of the mole number of sulfur relative to the total mole number of selenium and sulfur in the second semiconductor nanocrystal shell is within the disclosed ranges, the offset of the energy band between the core and the shell of the quantum dot becomes larger, and the structure of the shell surrounding the core becomes more uniform, and the produced quantum dot may be more structurally stable.

In an embodiment, the percentage of the mole number of sulfur relative to the total mole number of sulfur and selenium in the second semiconductor nanocrystal shell may be greater than or equal to about 85 mol %, greater than or equal to about 87 mol %, greater than or equal to about 90 mol %, greater than or equal to about 93 mol %, greater than or equal to about 95 mol %, greater than or equal to about 97 mol %, greater than or equal to about 98 mol %, or greater than or equal to about 99 mol %, for example, about 85 mol % to about 100 mol %, about 88 mol % to about 100 mol %, about 90 mol % to about 100 mol %, about 93 mol % to about 100 mol %, about 95 mol % to about 100 mol %, or about 97 mol % to about 100 mol %, but is not limited thereto.

The semiconductor nanocrystal shell may have a composition that changes in the radial direction. For example, the semiconductor nanocrystal shell may have a composition in which a sulfur content increases and a selenium content decreases in a direction from the semiconductor nanocrystal core to the outermost portion of the semiconductor nanocrystal shell. In an embodiment, the outermost portion of the semiconductor nanocrystal shell may be composed of ZnS. By including a nanocrystal of ZnS in the outermost portion of the semiconductor nanocrystal shell, the quantum dot according to an embodiment becomes more structurally stable, thus two peaks of the first exciton absorption peak and the second exciton absorption peak in the UV-Vis absorption spectrum are exhibited, the quantum efficiency (quantum yield) may be greater than or equal to about 80%, and the full width at half maximum (FWHM) of the emission peak may be lowered to less than or equal to about 50 nm.

The semiconductor nanocrystal forming the core of the quantum dot according to an embodiment may include a Group III-V compound and may include, for example, indium (In), which is a group IIIA element, and phosphorus (P), a Group V element. In addition, the semiconductor nanocrystal may further include zinc (Zn), a Group IIB element, together with indium and phosphorus. Since the semiconductor nanocrystal forming the core further includes zinc in addition to the Group III-V compound, the quantum dot according to an embodiment may emit green light having an emission peak in the range of about 500 nm to about 550 nm.

The size of the core in the quantum dot may be appropriately selected taking into consideration the emission wavelength. According to an embodiment, the size of the core of the quantum dot emitting green light having an emission peak in the range of about 500 nm to about 550 nm may be greater than or equal to about 1 nm, greater than or equal to about 1.5 nm, or greater than or equal to about 2 nm, but is not limited thereto. In addition, the size of the core may be, for example, less than or equal to about 4 nm, or less than or equal to about 3 nm, but is not limited thereto.

A quantum dot-based display device may show improved color purity, luminance, and the like. For example, a liquid crystal display (hereinafter, LCD) realizes, e.g., displays, colors by polarized light passing through, an absorption type color filter after passing through, a liquid crystal. LCD has a problem of a narrow viewing angle and low light transmittance due to the absorption type color filter. A quantum dot may emit light having theoretical quantum efficiency (QY) of about 100% and high color purity (e.g., less than or equal to about 40 nm of a full width at half maximum (FWHM)) and thus achieve increased luminous efficiency and improved color reproducibility. The absorption type color filter may be replaced with a photoluminescent type color filter including the quantum dot to realize, e.g., provide, a wider viewing angle and improved luminance.

The quantum dot may be dispersed in a host matrix (e.g., including a polymer, an inorganic material, or a combination thereof) to form a composite in order to be applied to a device. A quantum dot-polymer composite or color filter including the same may realize, e.g., provide, a display with high luminance, a wide viewing angle, and high color reproducibility. However, a weight of the quantum dot that may be included in the composite for the application may be limited due to various process reasons, e.g., processing conditions. Therefore, development of a quantum dot having thermal stability and being able to simultaneously exhibit improved blue absorption rate and improved luminance at a given weight is desired.

As described above, the quantum dot according to an embodiment includes a core including a semiconductor nanocrystal including a Group III-V compound, a first semiconductor nanocrystal shell disposed on the core and including zinc, selenium, and optionally sulfur, and a second semiconductor nanocrystal shell disposed on the first semiconductor nanocrystal shell and including zinc, sulfur, and optionally selenium and is a cadmium-free quantum dot that does not include cadmium, and it has a structural stability that shows both first exciton absorption peak and second exciton absorption peak in the UV-Vis absorption spectrum while emitting about 500 nm to about 550 nm range, that is, green light. Therefore, the quantum dot according to an embodiment may have quantum efficiency of greater than or equal to about 80%, greater than or equal to about 85%, greater than or equal to about 88%, or greater than or equal to about 90%, a full color at half maximum (FWHM) of emission peak of less than or equal to about 50 nm, or less than or equal to about 45 nm, which indicates high color purity. Accordingly, when the composite is formed by being dispersed in a host matrix including a polymer, an inorganic material, or a combination thereof for application in an optical device, the quantum dot-polymer composite, or the color filter including the same may achieve high luminance and color purity, even if included in the same amount or an amount less than that of a comparative quantum dot.

In an embodiment, the quantum dot may include an InZnP core, and while emitting green light, an amount of indium relative to sulfur and selenium in the semiconductor nanocrystal shell may be in a predetermined range. The size of the quantum dot may be greater than or equal to about 1 nm, greater than or equal to about 2 nm, greater than or equal to about 3 nm, greater than or equal to about 4 nm, or greater than or equal to about 5 nm, for example, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, or less than or equal to about 7 nm. The size of the quantum dot may be a particle diameter. The size of the quantum dot may be a diameter calculated by converting a two-dimensional area identified by transmission electron microscopic analysis into a circle (when the quantum dot is not a spherical shape).

The quantum dot is not limited to particular shapes, and may have, for example, a shape of a sphere, a polyhedron, a pyramid, a multipod, a cube, a nanotube, a nanowire, a nanofiber, a nanosheet, or a combination thereof, but is not limited thereto.

The quantum dot may include an organic ligand on a surface thereof, an organic solvent, or a combination thereof which are described later. The organic ligand, the organic solvent, or the combination thereof may be bound to the surface of the quantum dot.

The cadmium-free quantum dot according to an embodiment may be produced by preparing a core including a semiconductor nanocrystal including a Group III-V compound, reacting precursors forming the first semiconductor nanocrystal shell with the core to form a first semiconductor nanocrystal shell including zinc, selenium, and optionally sulfur on the core in a suitable solvent, and introducing precursors to form the second semiconductor nanocrystal shell including zinc and sulfur and optionally selenium on particles including the first semiconductor nanocrystal shell formed on the semiconductor nanocrystal core, by the reaction. Herein, the forming of the first semiconductor nanocrystal shell may include a reaction performed by adjusting amounts of precursors forming the first semiconductor nanocrystal shell, optionally, reaction temperatures, etc. and the percentage of the mole number of sulfur relative to the total mole number of selenium and sulfur in the first semiconductor nanocrystal shell may be less than or equal to about 10%, that is, about 0% to about 10%, for example, greater than about 0% and less than or equal to about 10%. In addition, the forming of the second semiconductor nanocrystal shell may include a reaction performed by adjusting amount(s) of precursor(s), reaction temperature(s), or a combination thereof and the percentage of the mole number of sulfur relative to the total mole number of selenium and sulfur in the second semiconductor nanocrystal shell may be about 80% to about 100%.

In the forming of the first semiconductor nanocrystal shell and the second semiconductor nanocrystal shell, an appropriate organic ligand, surfactant(s), or a combination thereof may be included in the reaction as desired. In addition, the preparing of the semiconductor nanocrystal core may include preparing precursors of the Group III-V compound for the production of the semiconductor nanocrystal core and reacting them to prepare (in-situ) the semiconductor nanocrystal core. A commercially available semiconductor nanocrystal core may be used. Such a method for producing the quantum dot according to an embodiment may be performed through various quantum dot producing methods.

As described above, the quantum dot according to an embodiment has the percentage of the mole number of sulfur relative to the total mole number of sulfur and selenium in the first semiconductor nanocrystal shell of less than or equal to about 10% and the percentage of the mole number of sulfur relative to the total mole number of sulfur and selenium in the second semiconductor nanocrystal shell formed on the first semiconductor nanocrystal shell of about 80% to about 100%, and accordingly a band offset difference of energy bands between the core and the shell increases, a lattice mismatch decreases, and thus the structure of quantum dot becomes more stable. Therefore, the quantum dot has an emission peak wavelength in the range of about 500 nm to about 550 nm and exhibits both first exciton absorption peak and second exciton absorption peak in the UV-Vis absorption spectrum, high quantum efficiency, for example quantum efficiency of greater than or equal to about 80%, and a low emission full width at half maximum (FWHM), for example, a full width at half maximum (FWHM) of less than or equal to about 50 nm, for example, less than or equal to about 45 nm, less than or equal to about 43 nm, less than or equal to about 42 nm, less than or equal to about 41 nm, or less than or equal to about 40 nm.

The cadmium-free quantum dot may not include gallium throughout the core or quantum dot. Further details on the cadmium-free quantum dot are the same as described above.

The precursors for forming the first semiconductor nanocrystal shell and the second semiconductor nanocrystal shell may include a zinc precursor, a selenium precursor, and a sulfur precursor.

For example, the zinc precursor may be a Zn metal powder, an alkylated Zn compound, a Zn alkoxide, a Zn carboxylate, Zn nitrate, Zn chlorate, Zn sulfate, Zn acetylacetonate, a Zn halide, Zn cyanide, Zn hydroxide, Zn oxide, Zn peroxide, or a combination thereof. For example, examples of the zinc precursor may be dimethylzinc, diethylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. Two or more different zinc precursors may be used.

The type of the selenium precursor is not particularly limited and may be appropriately selected. For example, the selenium precursor may be selenium, selenium-trioctylphosphine (Se-TOP), selenium-tributylphosphine (Se-TBP), selenium-triphenylphosphine (Se-TPP), tellurium-tributylphosphine (Te-TBP), or a combination thereof but is not limited thereto.

The types of the sulfur precursor are not particularly limited and may be appropriately selected. The sulfur precursor may include a sulfur powder, hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, or a combination thereof.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$ (wherein, R and R' are independently a C1 to C24 aliphatic hydrocarbon (e.g., a C1 to C24 alkyl group, a C2 to C24 alkenyl group, a C2 to C24 alkynyl group), or a C6 to C20 aromatic hydrocarbon (e.g., a C6 to C20 aryl group)), or a combination thereof.

The organic ligand may coordinate, e.g., bind to, the surface of the obtained nanocrystal and help the nanocrystal to be well dispersed in the solution, have an effect on light emitting and electrical characteristics of quantum dots, or a combination thereof. Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO)); diphenyl phosphine, a triphenyl phosphine compound, or an oxide compound thereof; phosphonic acid and the like, but are not limited thereto. Two or more different organic ligands may be used.

The solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether or benzyl ether, or a combination thereof. The type and the amount of the solvent may be appropriately selected taking into consideration types and amounts of the used precursors and organic ligands.

The reaction may include adding, injecting, or a combination thereof the semiconductor nanocrystal core, precursors for forming the first semiconductor nanocrystal shell, precursors for forming the second semiconductor nanocrystal shell, the organic ligands, or a combination thereof in, e.g., to, the solvent in each step to prepare a mixture, and heating the mixture, optionally up to a predetermined temperature, for example, greater than or equal to about 100° C., greater than or equal to about 110° C., greater than or equal to about 120° C., greater than or equal to about 150° C., greater than or equal to about 200° C., greater than or equal to about 250° C., greater than or equal to about 270° C., or greater than or equal to about 280° C., for example, under vacuum, inert atmosphere, or a combination thereof. After the mixture is optionally heated up to the predetermined temperature, the mixture may be cooled again before additional reactants, for example, precursors for preparing the first semiconductor nanocrystal shell and precursors for the second semiconductor nanocrystal shell is added thereto. The cooling temperature may be, for example, less than or equal to about 150° C., less than or equal to about 130° C., or less than or equal to about 100° C. As such, the reactants or reaction products may be cooled in the previous step again before adding additional reactants. The additional reactants may react abruptly when the additional reactants at elevated temperatures are added, and the second semiconductor nanocrystal shell may be prevented from being formed unevenly, in the presence of products formed in the previous step, for example, the first semiconductor nanocrystal shell formed on the semiconductor nanocrystal core.

Details of semiconductor nanocrystal cores including the Group III-V compounds are as described above. For example, the semiconductor nanocrystal core may include indium, a Group IIIA element, and phosphorus (P), a Group V element, and the semiconductor nanocrystal core may further include zinc (Zn), a Group IIB element together with indium and phosphorus. Such semiconductor nanocrystal core may be commercially available, or may be synthesized by various methods. The method of producing the core is not particularly limited, and for example, a method of producing an indium phosphide core may be used. In an embodiment, the core may be formed by a hot injection method in which a solution including a metal precursor, such as an indium precursor and optionally ligands at high temperature (e.g., temperature of greater than or equal to about 200° C.) is heated and a phosphorus precursor optionally together with a zinc precursor is added.

In an embodiment, in order to form the first semiconductor nanocrystal shell on the semiconductor nanocrystal core, a first mixture of the semiconductor nanocrystal core and precursors for forming the first semiconductor nanocrystal shell is prepared at an appropriate reaction temperature, for example, a first reaction temperature. In this case, the first reaction temperature may be, for example, greater than or equal to about 250° C., greater than or equal to about 260° C., greater than or equal to about 270° C., or greater than or equal to about 280° C., but is not limited thereto.

At the first reaction temperature, the first mixture is maintained for a predetermined time, for example, greater than or equal to about 30 minutes, greater than or equal to about 40 minutes, greater than or equal to about 60 minutes, or greater than or equal to about 70 minutes and less than or equal to about 2 hours, less than or equal to about 1.5 hours, and then a second mixture including particles that include the first semiconductor nanocrystal shell including zinc, selenium, and sulfur which is formed on the semiconductor nanocrystal core may be obtained. A percentage of the mole number of sulfur relative to the total mole number of selenium and sulfur in the produced first semiconductor nanocrystal shell may be about 1% to about 10% and the percentage of the mole number of sulfur relative to the total mole number of selenium and sulfur in the first semiconductor nanocrystal shell and the second semiconductor nanocrystal shell of the finally produced quantum dot may be adjusted to be less than or equal to about 40%, greater than or equal to about 25%, or a combination thereof.

Precursors for forming the second semiconductor nanocrystal shell are injected into the second mixture including the produced particles including the first semiconductor nanocrystal shell formed on the semiconductor nanocrystal core to form a third mixture, and then by heating the third mixture and reacting them, the second semiconductor nanocrystal shell may be formed on the first semiconductor nanocrystal shell. As described above, the second semiconductor nanocrystal shell includes zinc and sulfur, and optionally, may further include selenium. Therefore, the third mixture for forming the second semiconductor nanocrystal shell may further include precursors for forming the second semiconductor nanocrystal shell in the second mixture, that is, a zinc precursor, a sulfur precursor, and optionally a selenium precursor. Herein, as described above, before forming the third mixture, the semiconductor nanocrystal core may include cooling the second mixture including particles that include the first semiconductor nanocrystal shell. After preparing the third mixture by injecting the precursors for forming the second semiconductor nanocrystal shell in the cooled state, and heating the third mixture to a predetermined reaction temperature, that is, a second reaction temperature, the second semiconductor nanocrystal shell may be formed on the particles including the first semiconductor nanocrystal shell. As described above, the percentage of the mole number of sulfur relative to the total mole number of sulfur and selenium in the second semiconductor nanocrystal shell may be about 80% to about 100%. By adding non-solvent, a polar solvent that mixes with the solvent used in the reaction but does not disperse the quantum dot, to a fourth mixture including the quantum dot produced as described above in which the first semiconductor nanocrystal shell is formed on the semiconductor nanocrystal core, and the second semiconductor nanocrystal shell is formed on the first semiconductor nanocrystal shell, the produced particle, that is, the quantum dot in which the first semiconductor nanocrystal shell is formed on the semiconductor nanocrystal core, and the second semiconductor nanocrystal shell is formed may be precipitated and separated.

The outermost portion of the second semiconductor nanocrystal shell may include a semiconductor nanocrystal layer composed of only zinc and sulfur. In this case, the produced quantum dot may be more structurally stable.

The semiconductor device may further include a third semiconductor nanocrystal shell having a different composition from the first semiconductor nanocrystal shell, the second semiconductor nanocrystal shell between the first semiconductor nanocrystal shell and the second semiconductor nanocrystal shell of the quantum dot, or a combination thereof. In an embodiment, when the produced quantum dot includes all of the first semiconductor nanocrystal shell, the second semiconductor nanocrystal shell, and the third semiconductor nanocrystal shell, the semiconductor nanocrystal shell of the quantum dot may have a composition that changes in the radial direction of the quantum dot. The changed composition may have a concentration gradient in which the selenium content increases and the sulfur content decreases from the first semiconductor nanocrystal shell to the third semiconductor nanocrystal shell, a concentration gradient in which the sulfur content increases and the selenium content decreases from the third semiconductor nanocrystal shell to the second semiconductor nanocrystal shell, or a combination thereof. As such, adding additional selenium precursor, sulfur precursor, or a combination thereof to the second mixture to perform an additional reaction may involve injecting the selenium precursor, the sulfur precursor, or the combination thereof into a reactor with varying concentrations over several steps and the semiconductor nanocrystal shell may have a composition that changes in the radial direction, The quantum dot produced as described above may also have ligands coordinated to the surface.

The quantum dot produced as described above may be separated by adding non-solvent to the final reaction solution.

The non-solvent may be selected depending on the solvent used in the reaction and may be for example, acetone, methanol, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof.

The quantum dots separated by adding the non-solvent may be separated by centrifugation, precipitation, chromatography, or distillation. The separated nanocrystal may be added to a washing solvent and washed, if desired. The washing solvent has no particular limit and may have a similar solubility parameter to that of the ligand and may, for example, include hexane, heptane, octane, chloroform, toluene, benzene, and the like.

In an embodiment, a quantum dot composition includes the cadmium-free quantum dot according to an embodiment, a dispersing agent, a polymerizable monomer having a carbon-carbon unsaturated bond, and an initiator. The composition may further include an organic solvent.

In the composition, the cadmium-free quantum dot is described above. The amount of the quantum dot in the composition may be appropriately adjusted in view of a final use and the constituents and contents thereof of the composition. In an embodiment, the amount of the quantum dot may be greater than or equal to about 1 weight percent (wt %), greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of the composition. The amount of the quantum dot may be less than or equal to about 70 wt %, less than or equal to about 65 wt %, less than or equal to about 60 wt %, less than or equal to about 55 wt %, or less than or equal to about 50 wt %, based on a solid content.

In the composition according to an embodiment, the dispersing agent may include a polymer including a carboxylic acid group. The polymer may include a copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;
  a multiple aromatic ring-containing polymer having a backbone structure in which two aromatic rings are bound to a quaternary carbon atom that is a constituent atom of another cyclic moiety in the main chain and including a carboxylic acid group (—COOH); or
  a combination thereof.

The copolymer may include a first repeating unit derived from the first monomer and a second repeating unit derived from the second monomer, and optionally, may further include a third repeating unit derived from the third monomer.

The first repeating unit may include a unit represented by Chemical Formula 1-1, a unit represented by Chemical Formula 1-2, or a combination thereof:

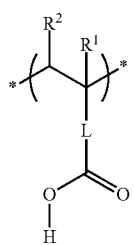

Chemical Formula 1-1 wherein, $R^1$ is hydrogen, a C1 to C3 alkyl group, or —$(CH_2)_n$—COOH (n is 0 to 2), $R^2$ is hydrogen, a C1 to C3 alkyl group, or —COOH, L is a direct bond, a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, and * is a linking portion with the adjacent atom,

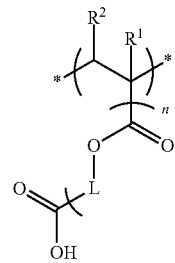

Chemical Formula 1-2 wherein, $R^1$ is hydrogen, a methyl group, or —$(CH_2)_n$—COOH (n is 0 to 2), $R^2$ is hydrogen or a C1 to C3 alkyl group, L is a C1 to C15 alkylene group, a C1 to C15 alkylene group in which at least one methylene group is replaced by —CO—, —O—, or —COO—, or a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, n is an integer of 1 to 3, and * is a linking portion with the adjacent atom.

The second repeating unit may include a unit represented by Chemical Formula 2-1, a unit represented by Chemical Formula 2-2, a unit represented by Chemical Formula 2-3, a unit represented by Chemical Formula 2-4, or a combination thereof:

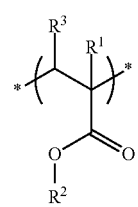

Chemical Formula 2-1 wherein, $R^1$ is hydrogen or a C1 to C3 alkyl group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, and * is a linking portion with the adjacent atom;

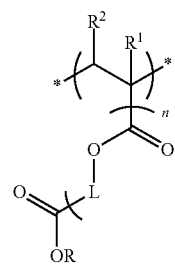

Chemical Formula 2-2 wherein, $R^1$ is hydrogen or a C1 to C3 alkyl group, L is a C1 to C15 alkylene group, a C1 to C15 alkylene group in which at least one methylene group is replaced by —CO—, —O—, or —COO—, a C6 to C30 aromatic hydrocarbon group, or a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group $R^3$ is hydrogen or a C1 to C3 alkyl group, n is an integer of 1 to 3, and * is a linking portion with the adjacent atom;

Chemical Formula 2-3

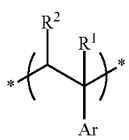

wherein, $R^1$ and $R^2$ are independently hydrogen or a C1 to C3 alkyl group, Ar is a substituted or unsubstituted C6 to C30 aromatic hydrocarbon group or C3 to C30 alicyclic hydrocarbon group, and * is a linking portion with the adjacent atom, Chemical Formula 2-4

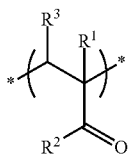

wherein, $R^1$ is hydrogen or a C1 to C3 alkyl group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, and * is a linking portion with the adjacent atom.

The third repeating unit may include a unit represented by Chemical Formula 3:

Chemical Formula 3

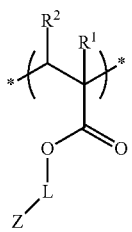

wherein, $R^1$ and $R^2$ are independently hydrogen or a C1 to C3 alkyl group, L is a 01 to 015 alkylene group, a C1 to C15 alkylene group in which at least one methylene group is replaced by —CO—, —O—, or —COO—, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, Z is a hydroxy group (—OH), a mercapto group (—SH), or amino group (—NHR, R is a C1 to C5 alkyl or hydrogen), and * is a linking portion with the adjacent atom.

Specific examples of the first monomer may include a carbonic acid vinyl ester compound such as acrylic acid, methacrylic acid, maleic acid, itaconic acid, fumaric acid, 3-butenoic acid, vinyl acetate, or vinyl benzoate, but are not limited thereto. The first monomer may be at least one compound.

Specific examples of the second monomer may be an alkenyl aromatic compound such as styrene, α-methyl styrene, vinyl toluene, or vinyl benzyl methyl ether; an unsaturated carbonic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; an unsaturated carbonic acid amino alkyl ester compound such as 2-amino ethyl acrylate, 2-amino ethyl methacrylate, 2-dimethyl amino ethyl acrylate, or 2-dimethyl amino ethyl methacrylate; a maleimide such as N-phenylmaleimide, N-benzylmaleimide, N-alkylmaleimide; an unsaturated carbonic acid glycidyl ester compound such as glycidyl acrylate or glycidyl methacrylate; a vinyl cyanide compound such as acrylonitrile, methacrylonitrile; or an unsaturated amide compound such as acryl amide or methacryl amide, but are not limited thereto. As the second monomer, one or at least one compound may be used.

Specific examples of the third monomer may include 2-hydroxyethyl acrylate, 2-hydroxyethyl methacrylate, 2-hydroxybutyl acrylate, or 2-hydroxybutyl methacrylate, but are not limited thereto. As the third monomer, one or at least one compound may be used.

In the polymer including the carboxylic acid group, an amount of the first repeating unit may be greater than or equal to about 10 mol %, greater than or equal to about 15 mol %, greater than or equal to about 25 mol %, or greater than or equal to about 35 mol %. In the polymer including the carboxylic acid group, the amount of the first repeating unit may be less than or equal to about 90 mol %, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the polymer including the carboxylic acid group, an amount of the second repeating unit may be greater than or equal to about 10 mol %, greater than or equal to about 15 mol %, greater than or equal to about 25 mol %, or greater than or equal to about 35 mol %. In the polymer including the carboxylic acid group, the amount of the second repeating unit may be less than or equal to about 90 mol %, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the polymer including the carboxylic acid group, an amount of the third repeating unit, if present, may be greater than or equal to about 1 mol %, greater than or equal to about 5 mol %, greater than or equal to about 10 mol %, or greater than or equal to about 15 mol %. In the polymer including the carboxylic acid group, the amount of the third repeating unit may be less than or equal to about 30 mol %, less than or equal to about 25 mol %, less than or equal to about 20 mol %, less than or equal to about 18 mol %, less than or equal to about 15 mol %, or less than or equal to about 10 mol %.

The polymer including the carboxylic acid group may be a copolymer of (meth)acrylic acid; and at least one second/third monomer that is an arylalkyl(meth)acrylate, hydroxyalkyl (meth)acrylate, or styrene. For example, the polymer including the carboxylic acid group may be a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

The polymer including the carboxylic acid group may include a multiple aromatic ring-containing polymer. The multiple aromatic ring-containing polymer has a backbone structure in which two aromatic rings are bound to a quaternary carbon atom that is a constituent atom of another cyclic moiety in the main chain (e.g., being bound to the main chain) and includes a carboxylic acid group (—COOH).

In the multiple aromatic ring-containing polymer, the backbone structure may include a unit represented by Chemical Formula A':

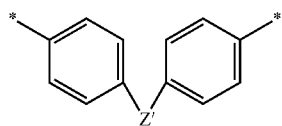

Chemical Formula A' wherein, * is a linking portion with an adjacent atom of the main chain of the binder, and $Z^1$ is a linking moiety represented by any one of Chemical Formulae A-1 to A-6, and in Chemical Formulae A-1 to A-6, and * is a linking portion with an aromatic moiety:

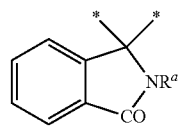

Chemical Formula A-1

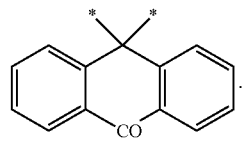

Chemical Formula A-2

Chemical Formula A-3

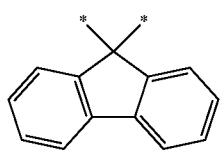

Chemical Formula A-4

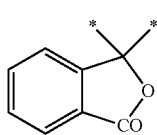

Chemical Formula A-5

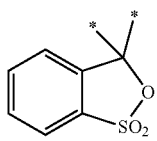

wherein, $R^a$ is a hydrogen, an ethyl group, $C_2H_4Cl$, $C_2H_4OH$, $CH_2CH=CH_2$, or a phenyl group, Chemical Formula A-6

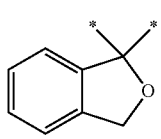

The multiple aromatic ring-containing polymer may include a structural unit represented by Chemical Formula B:

Chemical Formula B

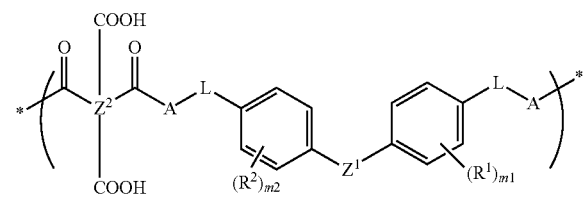

wherein $Z^1$ is one of linking moieties represented by Chemical Formulae A-1 to A-6, L is a direct bond, a C1 to C10 alkylene, a C1 to C10 alkylene having a substituent including a carbon-carbon double bond, a C1 to C10 oxy alkylene, or a C1 to C10 oxy alkylene having a substituent including a carbon-carbon double bond, A is —NH—, —O—, or a C1 to C10 alkylene, and $Z^2$ is a C6 to C40 aromatic organic group, $R^1$ and $R^2$ are independently a hydrogen atom, a halogen atom, or a substituted or unsubstituted C1 to C20 alkyl group, m1 and m2 are independently an integer ranging from 0 to 4, and * is a linking portion with the adjacent atom.

In Chemical Formula B, $Z^2$ may be any one of Chemical Formula B-1, Chemical Formula B-2 and Chemical Formula B-3:

Chemical Formula B-1

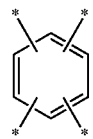

wherein * is a linking portion with an adjacent carbonyl carbon,

Chemical Formula B-2

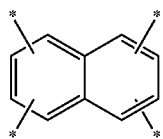

wherein * is a linking portion with carbonyl carbon,

Chemical Formula B-3

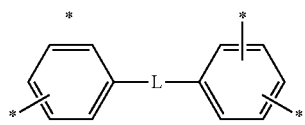

wherein * is a linking portion with an adjacent carbonyl carbon, L is a direct bond, —O—, —S—, —C(=O)—, —CH(OH)—, —S(=O)$_2$—, —Si(CH$_3$)$_2$—, (CH$_2$)$_p$ (wherein 1≤p≤10), (CF$_2$)$_q$ (wherein 1≤p≤10), —CR$_2$— (wherein R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula C:

Chemical Formula C

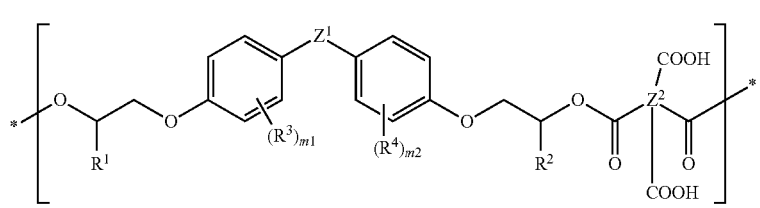

wherein R$^1$ and R$^2$ are independently hydrogen or a substituted or unsubstituted (meth)acryloyloxyalkyl group, R$^3$ and R$^4$ are independently hydrogen, a halogen, or a substituted or unsubstituted C1 to C20 alkyl group, Z$^1$ is a linking moiety represented by Chemical Formulae A-1 to A-6, Z$^2$ is a C6 to C40 aromatic organic group such as the moieties set forth above, m1 and m2 are independently an integer ranging from 0 to 4, and

* is a linking portion with the adjacent atom.

In an embodiment, the multiple aromatic ring-containing polymer may be an acid adduct of bisphenol fluorene epoxy acrylate. For example, the bisphenol fluorene epoxy acrylate may be prepared by reacting 4,4-(9-fluorenylidene)-diphenol and epichlorohydrin to obtain an epoxy compound having a fluorene moiety, and the epoxy compound is reacted with an acrylic acid to obtain a fluorenyl epoxy acrylate, which is then further reacted with biphthalic anhydride. The Reaction Scheme may be summarized as below:

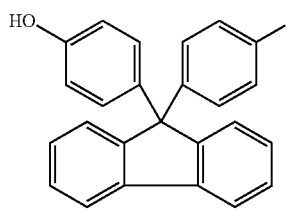

1) epichlorohydrin (12 eq)
   tetra methyl ammonium chloride (3 wt %)
   sodium hydroxide (1.3 eq) dimethyl sulfoxide 100° C., 6 h
2) aqueous sodium hydroxide (0.5 eq)
   4-methyl-2-pentanone 100° C., 6 h

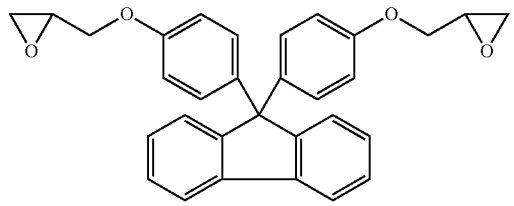

-continued

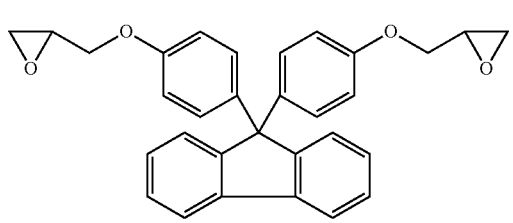

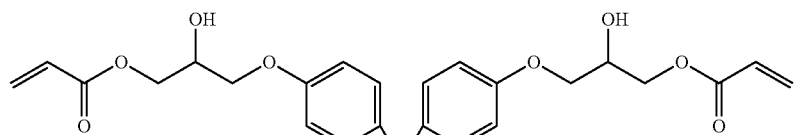

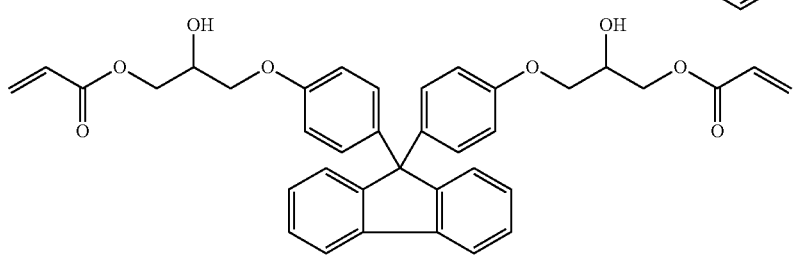

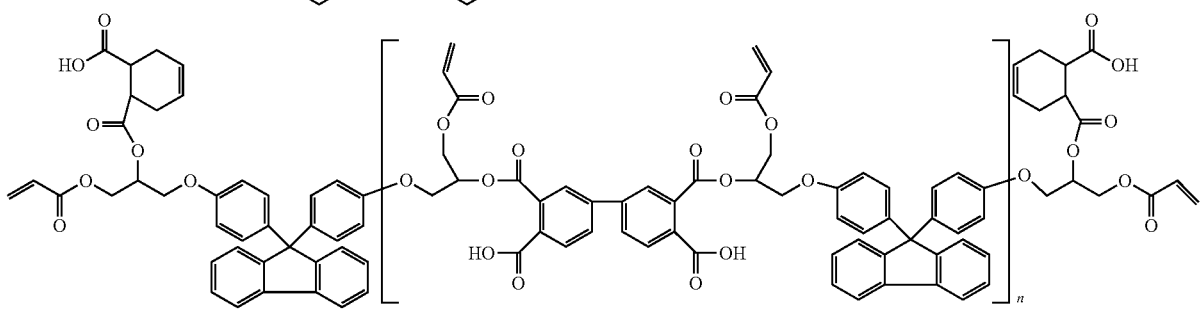

The multiple aromatic ring-containing polymer may include a functional group represented by Chemical Formula D at one or both terminal ends:

Chemical Formula D

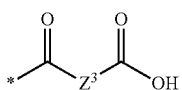

wherein, in Chemical Formula D, $Z^3$ is a moiety represented by one of Chemical Formulae D-1 to D-7, and * is a linking portion with an adjacent atom:

Chemical Formula D-1

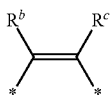

wherein, $R^b$ and $R^c$ are independently a hydrogen atom, a substituted or unsubstituted C1 to C20 alkyl group, or a substituted or unsubstituted C1 to C20 alkyl group in which at least one methylene is replaced by an ester group, an ether group, or a combination thereof.

Chemical Formula D-2

Chemical Formula D-3

Chemical Formula D-4

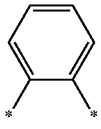

Chemical Formula D-5

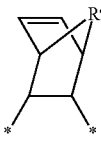

wherein, $R^d$ is O, S, NH, a substituted or unsubstituted C1 to C20 alkylene group, a C1 to C20 alkylamine group, or a C2 to C20 alkenylamine group.

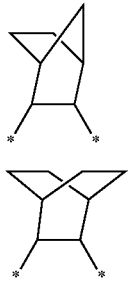

Chemical Formula D-6

Chemical Formula D-7

The multiple aromatic ring-containing polymer may be synthesized or commercially available (e.g., from Nippon Steel Chemical Co., Ltd.).

For non-limiting examples, the multiple aromatic ring-containing polymer may include a moiety derived from a reaction product of a fluorene compound of 9,9-bis(4-hydroxyphenyl)fluorene, 9,9-bis(4-aminophenyl)fluorene, 9,9-bis[4-(glycidyloxy)phenyl]fluorene, or 9,9-bis[4-(2-hydroxyethoxy)phenyl]fluorene with an appropriate compound capable of reacting with the fluorene compound (e.g., an aromatic dianhydride such as 9,9-bis-(3,4-dicarboxyphenyl)fluorene dianhydride, pyromellitic dianhydride (PMDA), biphenyltetracarboxylic dianhydride (BPDA), benzophenol tetracarboxylic dianhydride, and naphthalene tetracarboxylic dianhydride, a C2 to C30 diol compound, epichlorohydrin, or the like).

The fluorene compound, dianhydrides, a diol compound, and the like may be commercially available, and any suitable reaction conditions therebetween may be used.

The polymer including the carboxylic acid group may have an acid value of greater than or equal to about 50 milligrams of potassium hydroxide per gram (mg KOH/g). For example, the polymer including the carboxylic acid group may have an acid value of greater than or equal to about 60 mg KOH/g, may have an acid value of greater than or equal to about 70 mg KOH/g, may have an acid value of greater than or equal to about 80 mg KOH/g, may have an acid value of greater than or equal to about 90 mg KOH/g, may have an acid value of greater than or equal to about 100 mg KOH/g, may have an acid value of greater than or equal to about 110 mg KOH/g, may have an acid value of greater than or equal to about 120 mg KOH/g, may have an acid value of greater than or equal to about 125 mg KOH/g, or may have an acid value of greater than or equal to about 130 mg KOH/g. The polymer including the carboxylic acid group may have an acid value of, for example, less than or equal to about 250 mg KOH/g, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The quantum dot is mixed with a solution containing a polymer with a range of these acid values to form quantum dot-polymer dispersion. The formed quantum dot-polymer dispersion may exhibit improved compatibility with the rest of the composition (e.g., photopolymerizable monomer, photoinitiator, solvent, etc.) and the quantum dot may be relatively uniformly dispersed in the final composition (i.e., photosensitive composition).

The polymer (e.g., including the carboxylic acid group) may have a weight average molecular weight of greater than or equal to about 1,000 grams per mole (g/mol), greater than or equal to about 2,000 g/mol, greater than or equal to about 3,000 g/mol, or greater than or equal to about 5,000 g/mol. The polymer may have a weight average molecular weight of less than or equal to about 100,000 g/mol, or less than or equal to about 50,000 g/mol.

In the composition, an amount of the polymer may be greater than or equal to about 0.5 wt %, greater than or equal to about 1 wt %, greater than or equal to about 5 wt %, greater than or equal to about 10 wt %, greater than or equal to about 15 wt %, or greater than or equal to about 20 wt %, based on a total weight of the composition, but is not limited thereto. The amount of the polymer may be less than or equal to about 50 wt %, less than or equal to about 40 wt %, less than or equal to about 35 wt %, less than or equal to about 33 wt %, or less than or equal to about 30 wt %, based on a total weight of the composition. Within these ranges, the dispersion of quantum dots may be ensured. The amount of the polymer may be about 0.5 wt % to about 55 wt %, based on a total solid weight of the composition.

In the composition, the (photo)polymerizable monomer including at least one, for example, at least two, or at least three carbon-carbon unsaturated bonds may include the (meth)acryl-based monomer. Examples of the (meth)acryl-based monomer may be a C1-C10 alkyl(meth)acrylate, ethylene glycoldi(meth)acrylate, triethylene glycoldi(meth)acrylate, diethylene glycoldi(meth)acrylate, 1,4-butanedioldi(meth)acrylate, 1,6-hexanedioldi(meth)acrylate, neopentylglycoldi(meth)acrylate, pentaerythritoldi(meth)acrylate, pentaerythritoltri(meth)acrylate, pentaerythritoltetra(meth)acrylate, dipentaerythritol di(meth)acrylate, dipentaerythritol tri(meth)acrylate, dipentaerythritol penta(meth)acrylate, pentaerythritolhexa(meth)acrylate, bisphenol A di(meth)acrylate, bisphenol A epoxyacrylate, trimethylolpropanetri(meth)acrylate, ethylene glycolmonomethylether (meth)acrylate, novolac epoxy (meth)acrylate, diethylene glycoldi(meth)acrylate, triethylene glycoldi(meth)acrylate, propylene glycoldi(meth)acrylate, tris(meth)acryloyloxyethyl phosphate, or a combination thereof.

An amount of the photopolymerizable monomer may be greater than or equal to about 0.5 wt %, greater than or equal to about 1 wt %, or greater than or equal to about 2 wt %, based on a total weight of the composition. The amount of the photopolymerizable monomer may be less than or equal to about 50 wt %, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The (e.g., photo) initiators included in the composition are compounds capable of initiating radical polymerization of the aforementioned photopolymerizable acrylic monomer, thiol compounds, or a combination thereof (e.g., by light). The type of initiator is not particularly limited. The photoinitiator may include a triazine-based compound, an acetophenone compound, a benzophenone compound, a thioxanthone compound, a benzoin compound, an oxime ester compound, an aminoketone compound, a phosphine or phosphineoxide compound, a carbazole-based compound, a diketone compound, a sulfonium borate-based compound, a diazo compound, a biimidazole-based compound, or a combination thereof, but is not limited thereto.

Non-limiting examples of the triazine-based compound may include 2,4,6-trichloro-s-triazine, 2-phenyl-4,6-bis (trichloromethyl)-s-triazine, 2-(3',4'-dimethoxy styryl)-4,6-bis(trichloromethyl)-s-triazine, 2-(4'-methoxy naphthyl)-4, 6-bis(trichloromethyl)-s-triazine, 2-(p-methoxy phenyl)-4, 6-bis(trichloromethyl)-s-triazine, 2-(p-tolyl)-4,6-bis (trichloromethyl)-s-triazine, 2-biphenyl-4,6-bis (trichloromethyl)-s-triazine, bis(trichloromethyl)-6-styryl-s-triazine, 2-(naphth-1-yl)-4,6-bis(trichloromethyl)-s-triazine, 2-(4-methoxy naphth-1-yl)-4,6-bis(trichloromethyl)-s-triazine, 2,4-trichloromethyl(piperonyl)-6-triazine, or 2,4-(trichloromethyl(4'-methoxy styryl)-6-triazine, but are not limited thereto.

Examples of the acetophenone-based compound may include 2,2'-diethoxy acetophenone, 2,2'-dibutoxy acetophenone, 2-hydroxy-2-methyl propiophenone, p-t-butyl trichloroacetophenone, p-t-butyl dichloroacetophenone, 4-chloroacetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, and the like, but are not limited thereto.

Examples of the benzophenone-based compound may include benzophenone, benzoyl benzoate, benzoyl benzoate methyl, 4-phenyl benzophenone, hydroxy benzophenone, acrylated benzophenone, 4,4'-bis(dimethyl amino)benzophenone, 4,4'-dichlorobenzophenone, or 3,3'-dimethyl-2-methoxy benzophenone, but are not limited thereto.

Examples of the thioxanthone-based compound may include thioxanthone, 2-methyl thioxanthone, isopropyl thioxanthone, 2,4-diethyl thioxanthone, 2,4-diisopropyl thioxanthone, 2-chlorothioxanthone, and the like, but are not limited thereto.

Examples of the benzoin compound may include benzoin, benzoin methyl ether, benzoin ethyl ether, benzoin isopropyl ether, benzoin isobutyl ether, benzyl dimethyl ketal, and the like, but are not limited thereto.

Examples of the oxime-based compound may include 2-(o-benzoyloxime)-1-[4-(phenylthio)phenyl]-1,2-octandione and 1-(o-acetyloxime)-1-[9-ethyl-6-(2-methylbenzoyl)-9H-carbazol-3-yl]ethanone, but are not limited thereto.

In the composition, the amount of the initiator may be appropriately adjusted taking into consideration the type and amount of the used photopolymerizable monomer. In an embodiment, the amount of the initiator may be about 0.01 wt % to about 10 wt %, based on a total weight of the composition, but is not limited thereto.

The composition may further include a (multi- or monofunctional) thiol compound having at least one thiol group at the end, a metal oxide particulate, or a combination thereof.

The metal oxide particulate may include $TiO_2$, $SiO_2$, $BaTiO_3$, $Ba_2TiO_4$, $ZnO$, or a combination thereof. An amount of the metal oxide in the composition may be less than or equal to about 15 wt %, based on the solid content of the composition. A diameter of the metal oxide particulate is not particularly limited and may be selected appropriately. The diameter of the metal oxide particulate may be greater than or equal to about 100 nm, for example be greater than or equal to about 150 nm, or be greater than or equal to about 200 nm and less than or equal to about 1,000 nm, or less than or equal to about 800 nm.

The multiple thiol compound may include a compound represented by Chemical Formula 6:

Chemical Formula 6

In Chemical Formula 6,
$R^1$ is hydrogen; a substituted or unsubstituted C1 to C30 linear or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C4 to C30 heteroarylalkyl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R are independently hydrogen or a C1 to C30 linear or branched alkyl group, provided that both are not hydrogen simultaneously); an isocyanate group; a halogen; —ROR' (wherein R is a substituted or unsubstituted C1 to C20 alkylene group, R' is hydrogen or a C1 to C20 linear or branched alkyl group); an acyl halide (—RC(=O)X, wherein R is a substituted or unsubstituted alkylene group, and X is a halogen); —C(=O)OR' (wherein R' is hydrogen or a C1 to C20 linear or branched alkyl group); —CN; —C(=O)NRR' or —C(=O)ONRR' (wherein R and R' are independently hydrogen or a C1 to C20 linear or branched alkyl group), $L_1$ is a carbon atom, a substituted or unsubstituted C1 to C30 alkylene group, a substituted or unsubstituted C3 to C30 cycloalkylene group, a substituted or unsubstituted C6 to C30 arylene group, or a substituted or unsubstituted C3 to C30 heteroarylene group, wherein methylene (—$CH_2$—) included in the substituted C1 to C30 alkylene group may be replaced by sulfonyl (—$SO_2$—), carbonyl (CO), ether (—O—), sulfide (—S—), sulfoxide (—SO—), ester (—C(=O)O—), an amide (—C(=O)NR—) (wherein R is hydrogen or a C1 to C10 alkyl group) or a combination thereof, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group in which at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), an amide (—C(=O)NR—) (wherein R is hydrogen or a C1 to C10 linear or branched alkyl group), an imine (—NR—) (wherein R is hydrogen or a C1 to C10 linear or branched alkyl group), or combination thereof, m is an integer of 1 or more,
k1 is 0 or an integer of 1 or more, k2 is an integer of 1 or more, and
the sum of m and k2 is an integer of 3 or more,
when $Y_1$ is not a single bond, m does not exceed the valence of $Y_1$, and the sum of k1 and k2 does not exceed the valence of $L_1$.

The multiple thiol compound may include a compound represented by Chemical Formula 6-1:

Chemical Formula 6-1

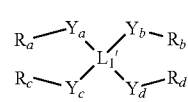

wherein, $L_1'$ is carbon, a substituted or unsubstituted C2 to C20 alkylene group, a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, $Y_a$ to $Y_d$ are independently a direct bond; a substituted or unsubstituted C1 to C30 alkylene group; a substituted or unsubstituted C2 to C30 alkenylene group; or a C1 to C30 alkylene group or a C2 to C30 alkenylene group in which at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), an amide (—C(=O)NR—) (wherein R is hydrogen or a C1 to C10 linear or branched alkyl group), an imine (—NR—) (wherein R is hydrogen or a C1 to C10 linear or branched alkyl group), or a combination thereof, and $R_a$ to $R_d$ are independently $R^1$ of Chemical Formula 6 or SH, provided that at least two of $R_a$ to $R_d$ are SH.

The multiple thiol compound may be a dithiol compound, a trithiol compound, a tetrathiol compound, or a combination thereof. For example, the thiol compound may be glycol di(3-mercaptopropionate), glycol dimercaptoacetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight of the composition. The amount of the thiol compound may be greater than or equal to about 0.1 wt %, greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %, based on a total weight of the composition.

The composition may further include an organic solvent, liquid vehicle, or a combination thereof. The type of organic solvent, liquid vehicle, or combination thereof that may be used is not particularly limited. The types and amounts of the organic solvent may be appropriately determined by taking into consideration the aforementioned main components (i.e., the quantum dot, the COOH group-containing binder, the photopolymerizable monomer, the photoinitiator, if used the thiol compound,) and a type and an amount of an additive which is described later. The composition may include a solvent in a residual amount except for a desired amount of the (non-volatile) solid. The solvent may be appropriately selected taking into consideration affinity for other components in the composition (e.g., the binder, the photopolymerizable monomer, the photoinitiator, and other additives), affinity for an alkali developing solution, and boiling points, and the like. Examples of the solvent/liquid vehicle may include ethylene glycols such as ethyl 3-ethoxy propionate, ethylene glycol, diethylene glycol, polyethylene glycol, and the like; glycolethers such as ethylene glycolmonomethylether, ethylene glycolmonoethylether, diethylene glycolmonomethylether, ethylene glycoldiethylether, diethylene glycoldimethylether, and the like; glycoletheracetates such as ethylene glycolacetate, ethylene glycolmonoethyletheracetate, diethylene glycolmonoethyletheracetate, diethylene glycolmonobutyletheracetate, and the like; propylene glycols such as propylene glycol, and the like; propylene glycolethers such as propylene glycolmonomethylether, propylene glycolmonoethylether, propylene glycolmonopropylether, propylenemonobutylether, propylene glycoldimethylether, dipropylene glycoldimethylether, propylene glycoldiethylether, dipropylene glycoldiethylether, and the like; propylene glycoletheracetates such as propylene glycolmonomethyletheracetate, dipropylene glycolmonoethyletheracetate, and the like; amides such as N-methylpyrrolidone, dimethyl formamide, dimethyl acetamide, and the like; ketones such as methylethylketone (MEK), methylisobutylketone (MIBK), cyclohexanone, and the like; petroleums such as toluene, xylene, solvent naphtha, and the like; esters such as ethyl acetate, butyl acetate, ethyl lactate, and the like; ethers such as diethyl ether, dipropyl ether, dibutyl ether, and the like; chloroform; C1 to C40 aliphatic hydrocarbons (alkane, alkene, alkyne); halogen- (e.g., chloro-) substituted C1 to C40 aliphatic hydrocarbons (dichloroethane, trichloromethane, etc.); C6 to C40 aromatic hydrocarbons (toluene, xylene, etc.); halogen-substituted C6 to C40 aromatic hydrocarbons; or combinations thereof.

The composition may further include various additives such as a light diffusing agent, a leveling agent, a coupling agent, and the like, as desired in addition to the aforementioned components. Amounts of the additives is not particularly limited, may be adjusted within an appropriate range wherein the additive does not cause an adverse effect on preparation of the composition, production of the quantum dot-polymer composite, and optionally a patterning of the composite.

The light diffusing agent may increase a refractive index of the composite and thus increase the possibility of incident light entered into the composite with quantum dots. The light diffusing agent may include inorganic oxide particles such as alumina, silica, zirconia, titanium oxide particulates, zinc oxide, and the like, and metal particles such as silver, copper, platinum, and the like, but is not limited thereto.

The leveling agent may decrease or prevent stains or spots of a composite film and may improve leveling characteristics of the composition before producing the composite. Types of the leveling agent are not particularly limited. For example, a fluorine-based leveling agent may include commercial products, for example BM-1000®, and BM-1100® (BM Chemie Inc.); MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.); and SH-28PA®, SH-190®, SH-193®, SZ-6032®, and SF-8428®, and the like of Toray Silicone Co., Ltd.).

The coupling agent may be used to increase adherence of the quantum dot-polymer composite or the composition to a substrate and may be a silane-based a coupling agent. Specific examples of the silane-based coupling agent may be vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxypropyl trimethoxysilane, 3-mercaptopropyl trimethoxysilane, and the like. Types and amounts of the additives may be adjusted as desired.

When present, amounts of the additives may be greater than or equal to about 0.1 wt %, greater than or equal to about 0.5 wt %, greater than or equal to about 1 wt %, greater than or equal to about 2 wt %, or greater than or equal to about 5 wt %, based on a total weight of the composition, but are not limited thereto. When present, the amounts of the additives may be less than or equal to about 20 wt %, less than or equal to about 19 wt %, less than or equal to about 18 wt %, less than or equal to about 17 wt %, less than or equal to about 16 wt %, or less than or equal to about 15 wt %, based on a total weight of the composition, but are not limited thereto.

The composition according to an embodiment may be prepared by a method including preparing quantum dot-polymer dispersion including the aforementioned cadmium-free quantum dot, polymer (including the carboxylic acid group (—COOH), and organic solvent; and mixing the photoinitiator; the photopolymerizable monomer (e.g., acryl-based monomer); optionally the thiol compound; optionally the metal oxide particulates; and optionally the additives with the quantum dot-polymer dispersion. The quantum dot polymer dispersion may be prepared by mixing a polymer solution with a quantum dot solution. The aforementioned each component may be mixed sequentially or simultaneously but mixing orders are not particularly limited.

The composition may provide a quantum dot-polymer composite or a quantum dot pattern by polymerization (e.g., initialed by light). Accordingly, in an embodiment, the quantum dot-polymer composite includes a polymer matrix; and the aforementioned cadmium-free quantum dot dispersed in the polymer matrix.

The polymer matrix includes a binder polymer, a polymerization product of a photopolymerizable monomer including a (at least one, at least two, at least three, at least four, or at least five) carbon-carbon unsaturated bond, and optionally a polymerization product of the photopolymerizable monomer and a multiple thiol compound having at least two thiol groups at a terminal end thereof. In an embodiment, the polymer matrix may include a cross-linked polymer and optionally a binder polymer (including a carboxyl group). The cross-linked polymer may include a thiolene resin, a cross-linked poly(meth)acrylate, or a combination thereof. In an embodiment, the cross-linked polymer may be a polymerization product of the aforementioned photopolymerizable monomer, and optionally the multiple thiol compound. The polymer is the same as described above.

The cadmium-free quantum dot, binder polymer, photopolymerizable monomer, and multiple thiol compound are the same as described above.

The quantum dot-polymer composite may be in the form of a film or sheet. The film of the quantum dot-polymer composite or quantum dot-polymer composite pattern that will be described later may have for example a thickness of less than or equal to about 30 μm, less than or equal to about 10 μm, less than or equal to about 8 μm, or less than or equal to about 7 μm and greater than about 2 μm, for example, greater than or equal to about 3 μm, greater than or equal to about 3.5 μm, greater than or equal to about 4 μm, greater than or equal to about 5 μm, or greater than or equal to about 6 μm. The sheet may have for example a thickness of less than or equal to about 1,000 μm, less than or equal to about 900 μm, less than or equal to about 800 μm, less than or equal to about 700 μm, less than or equal to about 600 μm, less than or equal to about 500 μm, or less than or equal to about 400 μm. The sheet may have for example a thickness of greater than or equal to about 10 μm, greater than or equal to about 50 μm, or greater than or equal to about 100 μm.

As described above, the quantum dot according to an embodiment has high quantum efficiency, and therefore, the quantum efficiency of the quantum dot-polymer composite is also very high. For example, when producing the quantum dot-polymer composite into a single layer having a thickness of about 6 μm, the photo-conversion efficiency (POB CE) may be greater than or equal to about 30% after post baking. For example, the photo-conversion efficiency after post baking of the single layer may be greater than or equal to about 31%, greater than or equal to about 32%, greater than or equal to about 33%, greater than or equal to about 34%, greater than or equal to about 35%, or greater than or equal to about 36%.

In an embodiment, the display device includes a light source and a light emitting element, for example, a photoluminescent element, the light emitting element includes the aforementioned quantum dot-polymer composite, and the light source is configured to provide incident light with the light emitting element. The incident light may have a photoluminescence peak wavelength of greater than or equal to about 440 nm, greater than or equal to about 450 nm, and less than or equal to about 460 nm.

In embodiment, the photoluminescent element may include a sheet of the quantum dot-polymer composite. The display device may further include a liquid crystal panel and the sheet of the quantum dot-polymer composite may be disposed between the light source and the liquid crystal panel. FIG. 1 shows an exploded view of a non-limiting display device. Referring to FIG. 1, the display device may have a structure wherein a reflector, a light guide panel (LGP) and a blue LED light source (Blue-LED), the aforementioned quantum dot-polymer composite sheet (QD sheet), and for example, various optical films such as a prism, a double brightness enhance film (DBEF), and the like are stacked and a liquid crystal panel is disposed thereon.

In an embodiment, the display device may include a stacked structure including a (e.g., transparent) substrate and a light emitting layer, for example, a photoluminescent layer disposed on the substrate as a light emitting element. In the stacked structure, the light emitting layer includes a pattern of the quantum dot-polymer composite and the pattern may include at least one repeating section to emit light at a predetermined wavelength. The pattern of the quantum dot-polymer composite may include at least one repeating section of a first section to emit a first light or a second section to emit a second light.

The first light and the second light have different maximum emission peak wavelengths in a photoluminescence spectrum. In an embodiment, the first light may be red light having a maximum emission peak wavelength of about 600 nm to about 650 nm (e.g., about 620 nm to about 650 nm), and the second light may be green light having a maximum emission peak wavelength of about 500 nm to about 550 nm (e.g., about 510 nm to about 550 nm).

The substrate may be a substrate including an insulation material. The substrate may include glass, various polymers such as polyesters such as polyethylene terephthalate (PET), polyethylene naphthalate (PEN), and the like, polycarbonate, polyacrylate, and the like; polysiloxane (e.g., polydimethylsiloxane (PDMS)); inorganic materials such as $Al_2O_3$, ZnO, and the like; or a combination thereof, but is not limited thereto. A thickness of the substrate may be appropriately selected taking into consideration the substrate material and the like, and is not particularly limited. The substrate may be flexible. The substrate may have a transmittance of greater than or equal to about 50%, greater than or equal to about 60%, greater than or equal to about 70%, greater than or equal to about 80%, or greater than or equal to about 90% for light emitted from the quantum dot.

At least a portion of the substrate may be configured to block (e.g., absorb or reflect) blue light. A layer capable of blocking blue light (blue light blocking layer) may be disposed at least a portion of the surfaces of the substrate. For example, the blue light blocking layer may include an organic material (e.g., polymer) and a predetermined dye (a yellow dye or a dye that transmits green/red light and absorbs blue light), but is not limited thereto.

In an embodiment, a method of producing the aforementioned stacked structure includes forming a film of the aforementioned composition on a substrate;

exposing selected regions of the film to light having, for example, a wavelength of less than or equal to about 400 nm; and developing the exposed film with an alkali developing solution to obtain a pattern of the quantum dot-polymer composite.

Figure 2:
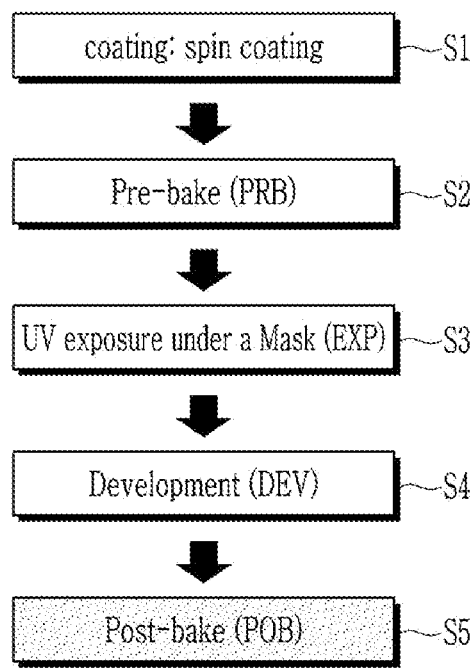
FIG. 2 shows a process for producing a quantum dot-polymer composite pattern using the composition according to an embodiment.
Figure 2:
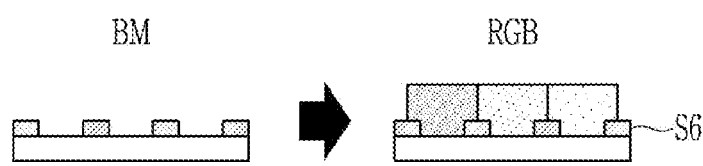

The substrate and the composition are the same as described above. A non-limiting method for forming the aforementioned pattern is explained referring to FIG. 2.

The aforementioned composition is coated to have a predetermined thickness on a substrate in an appropriate method of spin coating, slit coating, and the like. The formed film may be, optionally, pre-baked (PRB). The pre-baking may be performed by selecting an appropriate condition from conditions of a temperature, time, an atmosphere, and the like.

The formed (or optionally pre-baked) film is exposed to light having a predetermined wavelength under a mask having a predetermined pattern. A wavelength and intensity of the light may be selected taking into consideration types and amounts of the photoinitiator, types and amounts of the quantum dots, and the like.

The exposed film is treated with an alkali developing solution (e.g., dipping or spraying) to dissolve an unexposed region and obtain a desired pattern. The obtained pattern may be, optionally, post-baked (POB) to improve crack resistance and solvent resistance of the pattern, for example, at a temperature of about 150° C. to about 230° C. for a predetermined time (e.g., greater than or equal to about 10 minutes or greater than or equal to about 20 minutes).

When the quantum dot-polymer composite pattern has a plurality of repeating sections, the quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green quantum dot, or optionally, a blue quantum dot) and repeating formation of the aforementioned pattern using each composition an appropriate number of times (e.g., twice or more or three times or more).

In an embodiment, an ink composition including the aforementioned cadmium-free quantum dots may be used for pattern formation. For example, an ink including nanomaterials (e.g., cadmium-free quantum dots), liquid vehicle, monomers, and the like is deposited on a desired area of the substrate, and optionally the liquid vehicle may be removed, polymerization may be performed, or a combination hereof to form a pattern.

For example, the quantum dot-polymer composite may be a pattern in which two or more different color sections (e.g., RGB color sections) are repeated. This quantum dot-polymer composite pattern may be advantageously used as a photoluminescent type color filter in display devices.

In an embodiment, the display device includes a light source and a light emitting element including a stacked structure.

The light source may be configured to provide incident light to the light emitting element including the stacked structure. The incident light may have a photoluminescence peak wavelength in the range of about 440 nm to about 480 nm or about 440 nm to about 470 nm. The incident light may be third light.

In the display device including the aforementioned stacked structure, the light source includes a plurality of light emitting units respectively corresponding to the first section and the second section, and the light emitting units may include a first electrode and a second electrode facing each other and an electroluminescent layer disposed between the first electrode and the second electrode. The electroluminescent layer may include an organic light emitting material.

For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited.

Figure 3A:
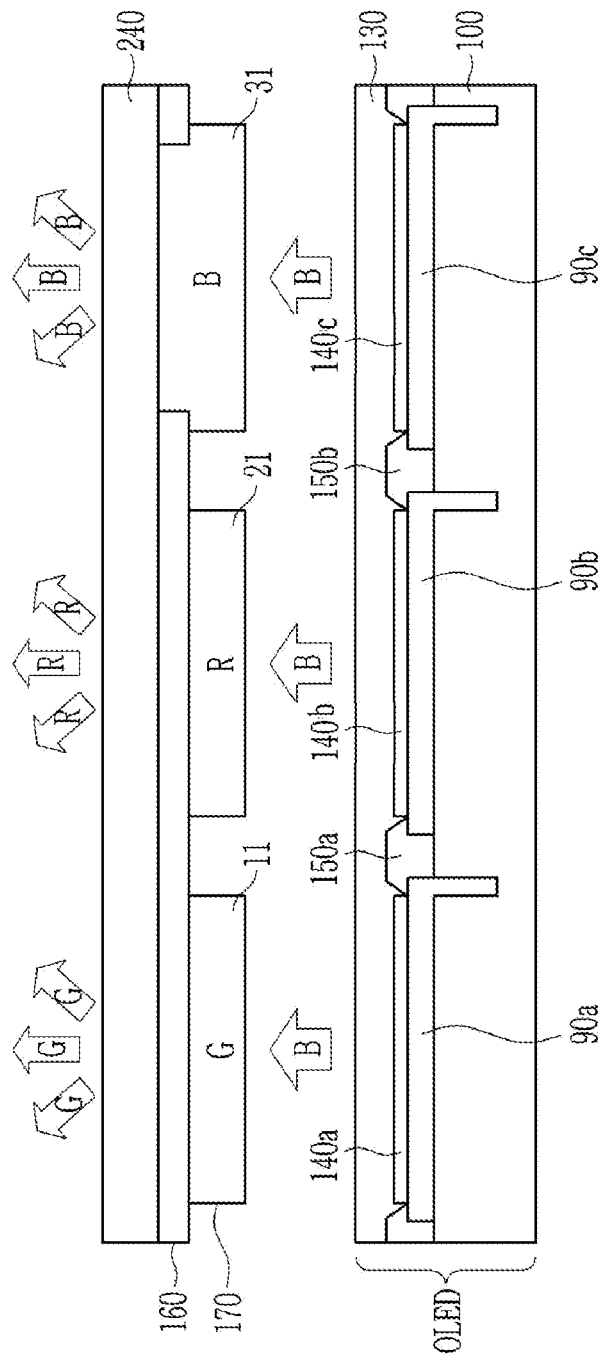
FIG. 3A is a schematic cross-sectional view of a display device according to an embodiment.
Figure 3B:
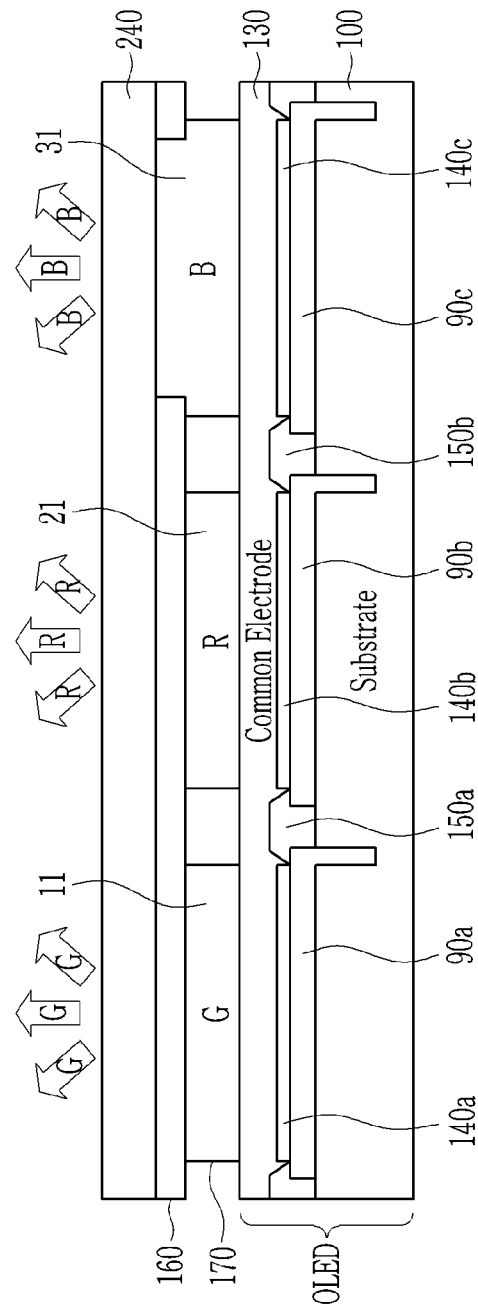
FIG. 3B is a schematic cross-sectional view of a display devices according to an embodiment.

FIG. 3A is a schematic cross-sectional view of a display device according to an embodiment and FIG. 3B is a schematic cross-sectional view of a display device according to an embodiments. Referring to FIGS. 3A and 3B, a light source includes an organic light emitting diode (OLED) (e.g., emitting blue light or light having a wavelength of less than or equal to about 500 nm). The organic light emitting diode (OLED) may include at least two pixel electrodes 90*a*, 90*b*, 90*c* formed on the substrate 100, a pixel define layer 150*a*, 150*b* formed between the adjacent pixel electrodes 90*a*, 90*b*, 90*c*, an organic light emitting layer 140*a*, 140*b*, 140*c* formed on each pixel electrode 130, and a common electrode layer formed on the organic light emitting layer 140*a*, 140*b*, 140*c*.

A thin film transistor and a substrate may be disposed under the organic light emitting diode (OLED). Details on the organic light emitting diode (OLEDs) are described above. The pixel areas of the organic light emitting diode (OLED) may be disposed to correspond to the first, second, and third sections, respectively, described later.

The stacked structure including the pattern of the quantum dot-polymer composite (e.g., a first section including green quantum dots and a second section including red quantum dots) and the substrate, or the quantum dot-polymer composite pattern may be disposed on the light source (e.g., directly on the light source).

Light (e.g., blue light) emitted from the light source enters the second section 21 and the first section 11 of the pattern 170, emitting red (R) and green (G) light, respectively. The blue (B) light emitted from the light source may pass through the third section 31. An optical element 160 (blue light blocking layer or first optical filter) that blocks (e.g., reflects or absorbs) blue (and optionally green) light may be disposed on the second section 21 that emits red light and the first section 11 that emits green light. The blue light blocking layer 160 may be disposed on the substrate 240.

The blue light blocking layer 160 may be disposed on the first section 11 and the second section 21 between the substrate 240 and the quantum dot-polymer composite pattern 170. Details of the blue light blocking layer are the same as those of the first optical filter 310 described below.

The device may be obtained by separately producing the stacked structure and (e.g., blue light emitting) OLED and then assembling the same. The device may be obtained by forming a quantum dot-polymer composite pattern directly on the OLED.

In an embodiment, the display device may further include a lower substrate, a polarizing plate disposed under the lower substrate, and a liquid crystal layer disposed between the stacked structure and the lower substrate, and in the stacked structure, the photoluminescent layer (i.e., quantum dot-polymer composite pattern) may be disposed to face the liquid crystal layer. The display device may further include a polarizing plate between the liquid crystal layer and the photoluminescent layer. The light source may further include LED and if desired, a light guide panel.

Figure 4:
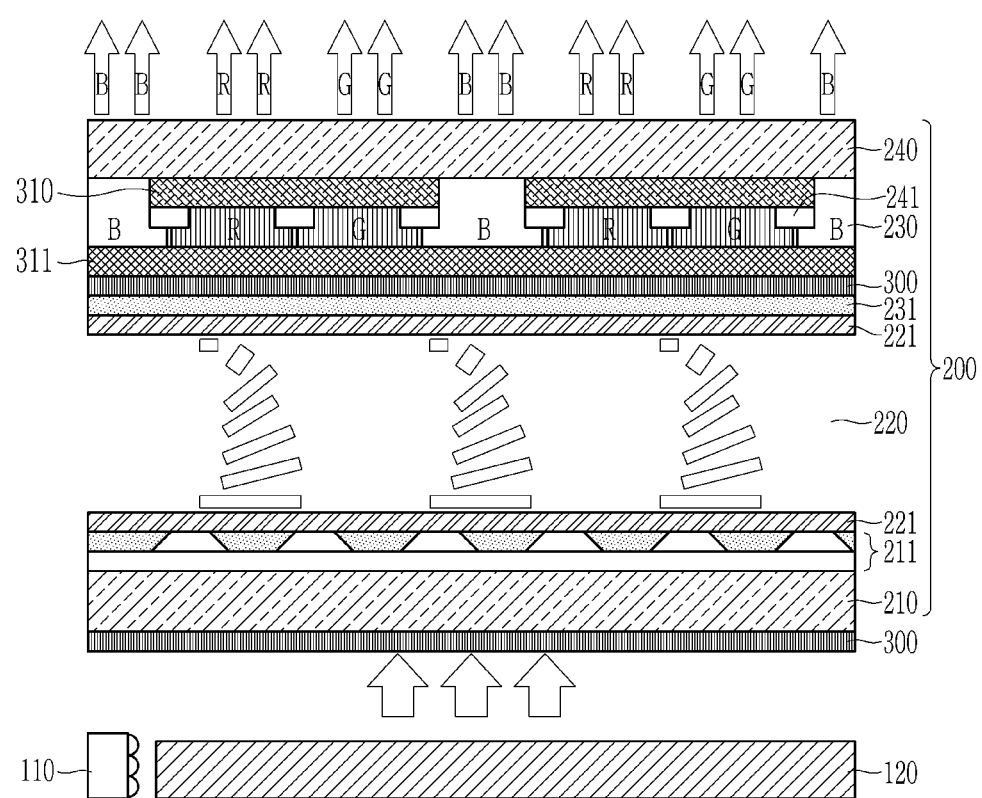
FIG. 4 shows a cross-sectional view of a display device according to an embodiment.

Referring to FIG. 4, in an embodiment, the display device includes a liquid crystal panel 200, an optical element 300 (e.g., polarizing plate) disposed on the liquid crystal panel 200, under the liquid crystal panel 200, or a combination thereof, and a backlight unit including a blue light emitting light source disposed under the bottom optical element 300. The backlight unit may include a light source 110 and a light guide panel 120 (edge type). The backlight unit may be a direct type (not shown) without a light guide panel. The liquid crystal panel 200 may include a lower substrate 210, an upper substrate 240, and a liquid crystal layer 220 disposed between the lower substrate 210 and the upper substrate 240 and may include a color filter layer 230 disposed on the top or bottom surface of the upper substrate 240. The color filter layer 230 may include the aforementioned quantum dot-polymer composite (or a pattern thereof).

A wire plate 211 is provided in an internal surface, for example, on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

In an embodiment, an upper optical element or an upper polarizing plate 300 may be provided between the liquid crystal layer 220 and the upper substrate 240, but is not limited thereto. For example, the upper polarizing plate may be disposed between the liquid crystal layer 220 or the common electrode 231 and the photoluminescent layer 230 (or the quantum dot-polymer composite pattern). In an embodiment, the optical element 300 may be a polarizer. A black matrix 241 is provided on the upper substrate (e.g., under the bottom surface thereof) and the black matrix 241 has openings and hides the gate line, a data line, and a thin film transistor of the wire plate on the lower substrate. A second color filter (R) that emits red light, a first color filter (G) that emits green light, and a third color filter (B) for (emission or transmission of) blue light may be disposed in the openings of the black matrix 241. For example, the black matrix 241 may have a lattice shape. If desired, the photoluminescent layer may further include at least one fourth section. The fourth section may include a quantum dot that emits different color from light emitted from the first to third sections (e.g., cyan, magenta, and yellow light).

The color filter layer 230 may be disposed on the transparent common electrode 231.

If desired, the display device may further have a blue light blocking layer (also referred to as a first optical filter layer). The blue light blocking layer may be disposed between bottom surfaces of the second section (R) and the first section (G) and the upper substrate 240, or on the top surface of the upper substrate 240. The blue light blocking layer may include a sheet having openings that correspond to a pixel area showing a blue color (e.g., third section) and may be formed on portions corresponding to the first and second sections. The first optical filter layer may be integrally formed as one body structure at the portions except portions overlapped with the third section, but is not limited thereto. At least two first optical filter layers may be spaced apart and be disposed on each of the portions overlapped with the first and the second sections.

For example, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, or yellow light that is mixed light thereof.

The first optical filter layer may include a polymer thin film including a dye, a pigment, or a combination thereof that absorbs light having a wavelength to be blocked. The first optical filter layer may block at least 80%, or at least 90%, even at least 95% of blue light having a wavelength of less than or equal to about 480 nm and it may have light transmittance of greater than or equal to about 70%, greater than or equal to about 80%, greater than or equal to about 90%, or even about 100% with respect to other visible light of greater than about 500 nm and less than or equal to about 700 nm.

The first optical filter layer may absorb and substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively.

For example, the first optical filter layer may include a first region, a second region, or a combination thereof, wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically separated by, for example, a black matrix, and the like. The first optical filter layer may contribute to improving color purity of a display device.

The first optical filter layer may be a reflective filter including a plurality of layers (e.g., inorganic material layers) with different reflective index. For example two layers having different reflective index may be alternately stacked with each other, or for example a layer having a high reflective index and a layer having a low reflective index may be alternately stacked with each other The display device may further include a second optical filter layer (e.g., red/green or yellow light recycling layer) disposed between the photoluminescent layer and the liquid crystal layer (e.g., between photoluminescent layer and upper polarizer) and transmitting at least a portion of the third light and reflecting at least a portion of the first light, at least a portion of the second light, or at least a portion of the first light and at least a portion of the second light. The second optical filter layer may reflect light in a wavelength region of greater than about 500 nm. The first light may be green (or red) light, the second light may be red (or green) light, and the third light may be blue light.

The display device may exhibit improved luminance (e.g., of greater than or equal to about 100 nit) and have a wide viewing angle (e.g., of greater than or equal to about 160 degrees).

An embodiment provides an electronic device including the aforementioned quantum dot. The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary embodiments of the present invention, and the present invention is not limited thereto.

EXAMPLES

Analysis Methods
1. Ultraviolet-Visible (UV-Vis) Spectroscopy
UV spectroscopy is performed by using an Agilent Cary5000 spectrometer to obtain a UV-Visible absorption spectrum.
2. Photoluminescence Analysis
Using a Hitachi F-7000 spectrometer, photoluminescence (PL) spectra of the produced quantum dots at excitation wavelength of 450 nanometers (nm) are obtained.
3. Absolute Quantum Efficiency (Quantum Yield) of Quantum Dots
Quantum efficiency is obtained by dividing the number of photons emitted along with photoluminescence from a sample by the number of photons absorbed by the sample. The quantum efficiency is measured with respect to the quantum dot dispersion or a quantum dot-polymer composite by using Otsuka QE-2100 quantum efficiency measuring system (Manufacturer: Otsuka Electronics).

4. Inductively Coupled Plasma (ICP) Analysis
Using Shimadzu ICPS-8100, an inductively coupled plasma atomic emission spectroscopy (ICP-AES) is performed.
5. Blue Light Absorption Rate and Photo-conversion Efficiency (CE) of Quantum Dot-Polymer Composite
The amount of light (B) of the blue excitation light is measured using an integrated hemisphere of Otsuka QE-2100 Quantum efficiency measuring system (Manufacturer: Otsuka Electronics). Subsequently, the quantum dot-polymer composite is placed in the integrated hemisphere and irradiated with blue excitation light, the amount of green (or red) light emitted from the composite and the amount of blue light (B') are measured.

From the measured values, the blue light absorption rate and photo-conversion efficiency are obtained by the following equation.

Blue light absorption rate (%)=(B−B')/B×100

Photo-conversion efficiency (CE, %)=A/(B−B')×100

Preparation of InZnP Core

Reference Example 1: An InZnP Core is Prepared in the Following Method

Indium acetate, zinc acetate, and palmitic acid are dissolved in 1-octadecene in a 200 milliliter (mL) reaction flask and then, heated at 120° C. under vacuum. The indium acetate and the zinc acetate are added in a mole ratio of about 1:1, and indium and the palmitic acid are used in a mole ratio of about 1:3. After 1 hour, an atmosphere in the reactor is converted into nitrogen. After heating the reactor at 260° C., a mixed solution of tris(trimethylsilyl)phosphine (TMS3P) and trioctylphosphine is rapidly injected thereinto and then, reacted for 20 minutes. The reaction solution is rapidly cooled down to room temperature, acetone is added thereto, and precipitates obtained by centrifuging the mixture are dispersed again in toluene. An amount of TMS3P is 0.5 mole based on 1 mole of indium. The obtained InZnP core has a size of about 2 nm.

Example 1

1. Synthesis of Quantum Dot and Analysis of Characteristics
(1) Selenium is dispersed in trioctylphosphine to prepare a Se/trioctylphosphine (TOP) stock solution, and sulfur is dispersed in trioctylphosphine to prepare a S/TOP stock solution.

In a 200 mL reaction flask, zinc acetate and oleic acid are dissolved in trioctylamine and then, vacuum-treated at 120° C. for 10 minutes. The reaction flask is internally substituted with $N_2$, the toluene dispersion of the InZnP core synthesized in Preparation Example 1 is injected thereinto, while the obtained solution is heated up to 320° C., and then, the Se/TOP stock solution is several times injected thereinto. A reaction is performed to obtain a reaction solution including particles having a ZnSe shell disposed on the core. A total reaction time is about 100 minutes, and a totally used amount of Se based on 1 mole of indium is about 23 moles.

Subsequently, at the above reaction temperature, the S/TOP stock solution is injected into the reaction solution. A reaction is performed to obtain a reaction solution including particles having a ZnS shell disposed on the ZnSe shell. A total reaction time is 60 minutes, and a totally used amount of S based on 1 mole of indium is about 13 moles. Subsequently, the solution is cooled down to room temperature, an excessive amount of ethanol is added thereto and then, centrifuged, and after discarding a supernatant, precipitates therefrom are dried and dispersed in toluene to obtain an InZnP/ZnSe/ZnS quantum dot solution.

Figure 5:
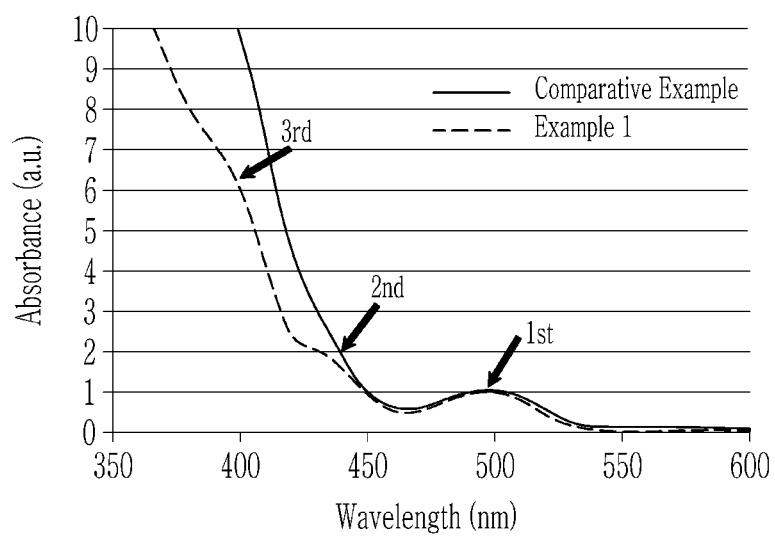
FIG. 5 shows UV-Vis absorption spectra of the quantum dots according to Example 1 and Comparative Example 1.

(2) A UV-vis spectroscopy graph of the obtained quantum dot is shown in FIG. 5. As shown in FIG. 5, first, second, and third exciton absorption peaks of the quantum dot all appear in the UV-Vis absorption spectrum. In addition, as a result of performing a photoluminescence analysis of the quantum dot, a photoluminescence peak appears at 522 nm, a full width at half maximum (FWHM) is 39 nm, and quantum efficiency is 87.8%.

Figure 6:
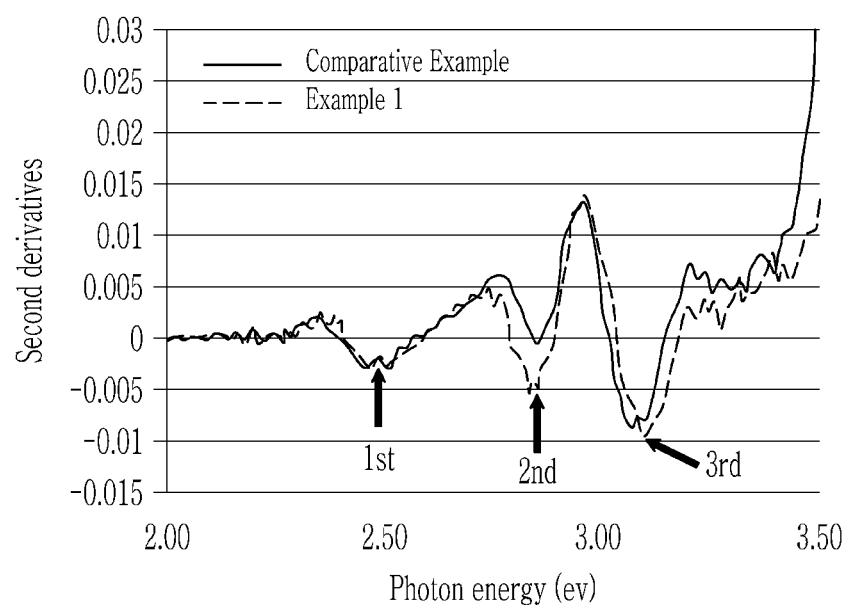
FIG. 6 shows the second derivatives of the UV-Vis absorption spectra of FIG. 5 with respect to the photon energy.

FIG. 6 shows the second derivatives of the UV-Vis absorption spectra of FIG. 5 with respect to the photon energy. Referring to the graph, an energy difference between the first exciton absorption peak and the second exciton absorption peak in the UV-Vis absorption spectrum of the quantum dot according to Example 1 is 0.34 electronvolts (eV), an energy difference between the first exciton absorption peak and the third exciton absorption peak is 0.60 eV, and an absolute value of the second derivative of the second exciton absorption peak is 0.0055.

On the other hand, as a result of performing an ICP-AES analysis of the quantum dot, a percentage of the mole number of sulfur relative to the total mole number of sulfur and selenium in the first semiconductor nanocrystal shell right on the core of the quantum dot is 0%.

The obtained result is shown in Table 1.

2. Production of Quantum Dot-Polymer Composite and Pattern Thereof (1) Preparation of Quantum Dot-Binder Dispersion Chloroform dispersion of the obtained quantum dot is mixed with a binder (a quatercopolymer of methacrylic acid, benzyl methacrylate, hydroxyethylmethacrylate, and styrene, an acid value: 130 milligrams of potassium hydroxide per gram (mg KOH/g), a molecular weight: 8,000, a methacrylic acid:benzylmethacrylate:hydroxyethylmethacrylate: styrene (a mole ratio)=61.5%:12%:16.3%:10.2%) solution (polypropylene glycol monomethyl ether acetate in 30 weight percent (wt %) of a concentration) to prepare quantum dot-binder dispersion.

(2) Preparation of Photosensitive Composition

The quantum dot binder dispersion is mixed with hexaacrylate having the following structure as a photopolymerizable monomer, glycoldi-3-mercaptopropionate (hereinafter, 2T), an oxime ester compound as an initiator, and TiO$_2$ as a light diffusing agent and propylene glycol methyl ether acetate (PGMEA) to prepare a composition.

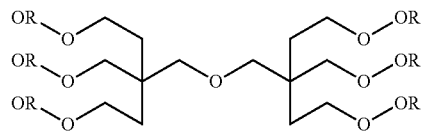

wherein

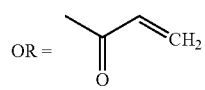

The composition includes 40 wt % of the quantum dot, 12.5 wt % of the binder polymer, 25 wt % of 2T, 12 wt % of the photopolymerizable monomer, 0.5 wt % of the initiator, and 10 wt % of the light diffusing agent based on a solid content of the composition, and a total solid content is 25%.

(3) Production of Quantum Dot-Polymer Composite Pattern and Heat Treatment

The photosensitive composition is spin-coated on a glass substrate at 150 rpm for 5 seconds to obtain a film. The film is pre-baked (PRB) at 100° C. These pre-baked films are exposed to irradiation of light (a wavelength: 365 nm, intensity: 100 millijoules (mJ)) for 1 second under a mask having a predetermined pattern (e.g., a square dot or stripe pattern), developed in a potassium hydroxide aqueous solution (a concentration: 0.043%) for 50 seconds to obtain quantum dot-polymer composite patterns (a thickness: 6 um).

The obtained pattern is heat-treated (POB) for 30 minutes under a nitrogen atmosphere.

The emission wavelength, blue light absorption rate, and photo-conversion efficiency of the obtained film are measured and the results are shown in Table 1.

Example 2 to Example 5

1. Synthesis of Quantum Dot and Analysis of Characteristics (1) Quantum dots according to Examples 2 to 5 are prepared according to the same method as Example 1 except that amounts of the selenium precursor and the sulfur precursor forming the semiconductor nanocrystal shell and an injection order thereof are controlled to have UV-Vis absorption spectra of FIG. 7.

Specifically, in a 200 mL reaction flask, zinc acetate and oleic acid are respectively dissolved in trioctylamine and then, vacuum-treated at 120° C. for 10 minutes. The reaction flask is internally substituted with N$_2$, the toluene dispersion of the InZnP core synthesized according to Preparation Example 1 is injected thereinto, while a temperature of the obtained solution is increased up to 320° C., and then, the Se/TOP stock solution of Example 1 and dodecane thiol are several times injected thereinto, while each amount thereof are respectively adjusted. A reaction is performed to obtain a reaction solution including particles having a ZnSeS shell respectively having different compositions and disposed on the core. Subsequently, the S/TOP stock solution is respectively injected into the reaction solutions at the reaction temperature. A reaction is performed to obtain a reaction solution including particles having a ZnS shell respectively disposed on the ZnSeS shell. Then, the solution is cooled down to room temperature, an excessive amount of ethanol is added thereto and then, centrifuged, and after discarding a supernatant, precipitates obtained therefrom are dried and dispersed to obtain InZnP/ZnSeS/ZnS quantum dot solutions according to Examples 2 to 5.

Figure 7:
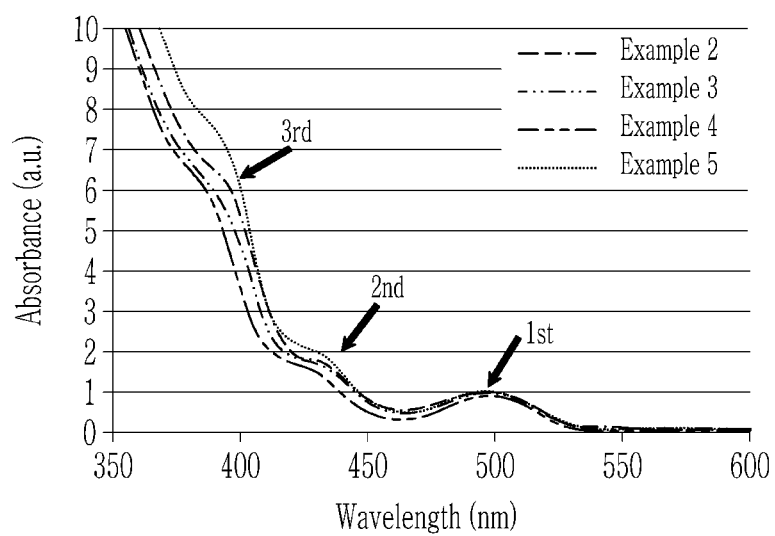
FIG. 7 shows UV-Vis absorption spectra of the quantum dots according to Example 2 to Example 5.

(2) UV-vis spectroscopic graphs of the quantum dots according to Examples 2 to 5 are shown in FIG. 7. As shown in FIG. 7, the quantum dots according to Examples 2 to 5 exhibit all first, second, and third exciton absorption peaks in the UV-Vis absorption spectra. As a result of performing a photoluminescence analysis of the quantum dots, photoluminescence peaks are shown between 520 nm to 525 nm, full widths at half maximum (FWHM) are between 39 nm to 50 nm, and quantum efficiency is all greater than 90%.

Figure 8:
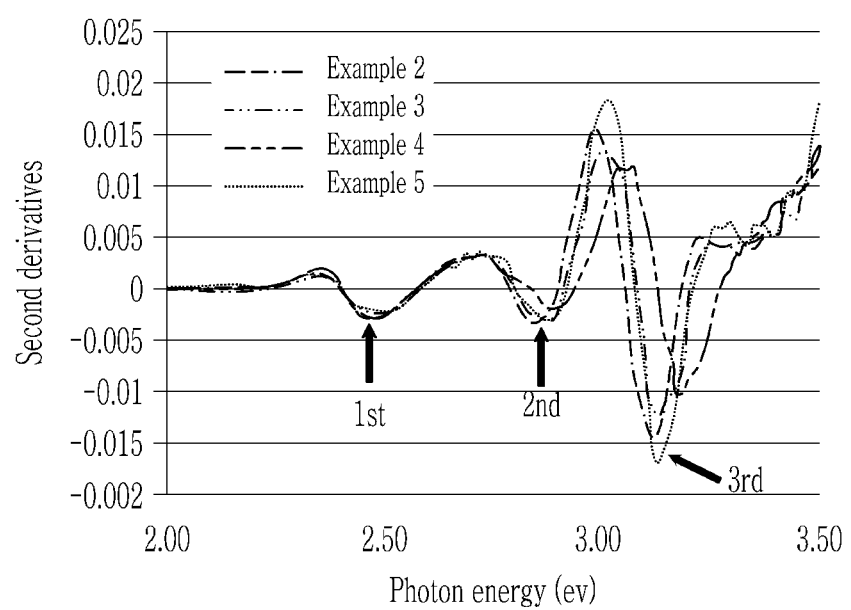
FIG. 8 is shows the second derivatives of the UV-Vis absorption spectra of FIG. 7 with respect to the photon energy.

FIG. 8 is shows the second derivatives of the UV-Vis absorption spectra of FIG. 7 with respect to the photon energy. Referring to the graph, in the UV-Vis absorption spectra of the quantum dots according to Examples 2 to 5, energy differences between first and second exciton absorption peaks are all greater than or equal to 0.35 eV, energy differences between first and third exciton absorption peaks are greater than or equal to 0.60 eV, and absolute values of the second derivatives of the second exciton absorption peaks are greater than or equal to 0.001.

On the other hand, as a result of performing an ICP-AES analysis of the quantum dots, ratios of the mole number of sulfur relative to the total mole number of sulfur and selenium in the first semiconductor nanocrystal shells right on the cores of the quantum dots are respectively in a range of 2% to 10%.

The obtained results are shown in Table 1.

2. Production of Quantum Dot-Polymer Composite and Pattern Thereof

Quantum dot-polymer composite patterns according to Examples 2 to 5 are formed according to the same method as Example 1 except that the quantum dots according to Examples 2 to 5 are respectively used, and then, emission wavelengths and photo-conversion efficiency of the obtained films (single layers) are measured, and the results are shown in Table 1.

Comparative Example

A quantum dot is prepared according to the same method as Example 1 except that amounts of zinc, selenium, and sulfur in a first semiconductor nanocrystal shell disposed on a core and a second semiconductor nanocrystal shell disposed on the first semiconductor nanocrystal shell are controlled to have the UV-Vis absorption spectrum of FIG. 5.

As shown in FIG. 5, the quantum dot according to comparative example exhibits an indistinguishably weak second exciton absorption peak. Accordingly, referring to FIG. 6 showing a second derivative of the absorption spectrum of FIG. 5, the quantum dot of comparative example exhibits 0.0004 of an absolute value of the second derivative of the second exciton absorption peak, which is less than 0.001.

In addition, a quantum dot-polymer composite film is formed according to the same method as Example 1 except that the quantum dot of comparative example is used, and as a result of measuring an emission wavelength of the obtained film (single layer), a wavelength of the single layer is 534.4 nm, photo-conversion efficiency (CE) after the post-baking is 29.5%, and a photo-conversion efficiency thereof is deteriorated compared with those of the quantum dot-polymer composite films according to Examples 1 to 5.

As shown in Table 1 and FIGS. 5 to 8, the quantum dots including the first semiconductor nanocrystal shell including zinc, selenium, and optionally, sulfur directly disposed on the Group III-V semiconductor nanocrystal core and the second semiconductor nanocrystal shell including zinc, sulfur, and optionally, selenium on the first semiconductor nanocrystal shell according to Examples 1 to 5 have an emission peak wavelength in a range of 500 nm to 550 nm and exhibit all first, second, and third exciton absorption peaks in the UV-Vis absorption spectra, greater than or equal to 0.34 eV of energy differences between the first and second exciton absorption peaks, and greater than or equal to of 0.001 of absolute values of the second derivatives of the second exciton absorption peaks. The quantum dots of Examples 1 to 5 exhibit very high quantum efficiency of greater than 87%. In addition, when the quantum dots according to Examples 1 to 5 are used to form each quantum dot-polymer composite film, high photo-conversion efficiency (CE) of greater than 30% after the post-baking (POB) is obtained. Particularly, the quantum dots according to Examples 2 to 5 which have greater than or equal to 0.35 eV of energy differences between the first and second exciton absorption peaks exhibit high quantum efficiency of greater than 90%, and when formed into each quantum dot-polymer composite film, photo-conversion efficiency (CE) after the post-baking (POB) is much increased compared with that of the composite film of the quantum dot according to Example 1 including no sulfur in the first semiconductor nanocrystal shell.

Furthermore, the quantum dots according to Examples 1 to 5 exhibit greater than or equal to 0.60 eV of energy differences between the first and third exciton absorption peaks in the UV-Vis absorption spectra, and even third exciton peaks as well as second exciton peaks are clearly seen. In addition, the quantum dots of Examples 2 to 5 having greater than or equal to 0.35 eV of the energy differences between the first exciton absorption peak and second exciton absorption peak exhibit greater than or equal to 0.63 eV of the energy differences between the first and third exciton absorption peaks, which is larger than 0.60 eV of the energy differences between the first and third exciton absorption peaks of the quantum dots of Example 1 having 0.34 eV of the energy differences between the first and second exciton absorption peaks. In other words, when the energy difference between the first and second exciton

TABLE 1

| | InP/ZnSeS/ZnS | | | Absolute value of second derivative of second exciton peak | Energy difference (eV) between first-second exciton peaks | Energy difference (eV) between first-third exciton peaks | Shell composition of first semiconductor nanocrystal S/(Se + S) × 100% | Single layer | |
|---|---|---|---|---|---|---|---|---|---|
| | PL (nm) | FWHM (nm) | QY (%) | | | | | Wavelength of single layer (nm) | POB photo-conversion efficiency of single layer (CE) |
| Example 1 | 522 | 39 | 87.8 | 0.0055 | 0.34 | 0.60 | 0% | 532.7 | 33.8% |
| Example 2 | 522 | 39 | 95.4 | 0.0035 | 0.36 | 0.63 | 2% | 534.2 | 36.3% |
| Example 3 | 523 | 39 | 93.2 | 0.0029 | 0.37 | 0.63 | 3% | 533.9 | 36.8% |
| Example 4 | 520 | 44 | 91.6 | 0.0019 | 0.39 | 0.68 | 8% | 532.8 | 33.3% |
| Example 5 | 523 | 50 | 91.7 | 0.0035 | 0.38 | 0.63 | 10% | 539.1 | 34.6% | absorption peaks is greater than 0.34 eV and thus greater than or equal to 0.35 eV, the energy difference between the first and third exciton absorption peaks is greater than 0.60 eV, or a combination thereof, luminous efficiency or quantum efficiency (QY) of the quantum dots and photo-conversion efficiencies (CE) of the quantum dot-polymer composites film including the quantum dots are much increased. In other words, when the energy differences between the first and second exciton peaks are greater than or equal to 0.35 eV, the energy differences between the first and third exciton absorption peaks are greater than 0.60 eV, or a combination thereof, a band offset difference of an energy band between core and shell becomes much larger and structurally more stable.

As examined above, the quantum dots according to Examples 1 to 5 have an increased band offset difference of the energy band between core-shell and thus a more stable structure, and accordingly, may exhibit high quantum efficiency, and the quantum dot-polymer composite films including the same may exhibit a high photo-conversion efficiency. In other words, excellent quantum efficiency of the quantum dots may contribute to increasing luminous efficiency of the quantum dot-polymer composites.

In conclusion, as a cadmium-free quantum dot including a semiconductor nanocrystal core including a Group III-V compound, a first semiconductor nanocrystal shell including zinc, selenium, and optionally, sulfur and disposed right on a core, and a second semiconductor nanocrystal shell including zinc, sulfur, and optionally, selenium and disposed on the first semiconductor nanocrystal shell, a quantum dot showing an emission peak wavelength in a range of about 500 nm to about 550 nm and also, first and second exciton absorption peaks in a UV-Vis absorption spectrum exhibits excellent quantum efficiency and a low full width at half maximum (FWHM) and thus may provide improved optical properties.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A quantum dot-polymer composite comprising
a polymer matrix; and
a plurality of quantum dots dispersed in the polymer matrix,
wherein the quantum dots comprise
a core comprising a semiconductor nanocrystal comprising a Group III-V compound; and
a semiconductor nanocrystal shell disposed on the core, the semiconductor nanocrystal shell comprising zinc, selenium, and sulfur, and
wherein the quantum dot does not comprise cadmium,
an emission peak wavelength of the quantum dot is in a range of about 500 nanometers to about 550 nanometers,
an ultraviolet-visible absorption spectrum of the quantum dot comprises a first exciton absorption peak having a first peak energy and a second exciton absorption peak having a second peak energy, and
an absolute value of a second derivative of the second peak energy of the second exciton absorption peak is greater than or equal to about 0.001.

2. The quantum dot-polymer composite of claim 1, wherein the absolute value of the second derivative of the second peak energy of the second exciton absorption peak is less than or equal to about 0.0055.

3. A quantum dot-polymer composite comprising
a polymer matrix; and
a plurality of quantum dots dispersed in the polymer matrix,
wherein the quantum dots comprise
a core comprising a semiconductor nanocrystal comprising a Group III-V compound; and
a semiconductor nanocrystal shell disposed on the core, the semiconductor nanocrystal shell comprising zinc, selenium, and sulfur, and
wherein the quantum dot does not comprise cadmium,
an emission peak wavelength of the quantum dot is in a range of about 500 nanometers to about 550 nanometers,
an ultraviolet-visible absorption spectrum of the quantum dot comprises a first exciton absorption peak and a second exciton absorption peak, and
a difference between an energy of the first exciton absorption peak and an energy of the second exciton absorption peak is greater than or equal to about 0.34 electronvolts.

4. The quantum dot-polymer composite of claim 3, wherein the difference between the energy of the first exciton absorption peak and the energy of the second exciton absorption peak is less than or equal to about 0.5 electronvolts.

5. The quantum dot-polymer composite of claim 3, wherein the ultraviolet-visible absorption spectrum of the quantum dot further comprises a third exciton ab sorption peak.

6. The quantum dot-polymer composite of claim 5, wherein a difference between the energy of the first exciton absorption peak and an energy of the third exciton absorption peak is greater than or equal to about 0.55 electronvolts.

7. The quantum dot-polymer composite of claim 3, wherein the semiconductor nanocrystal core comprises indium and phosphorus.

8. The quantum dot-polymer composite of claim 7, wherein the semiconductor nanocrystal core further comprises zinc.

9. A display device comprising
a light source, and
a light emitting element,
wherein the light emitting element comprises the quantum dot-polymer composite according to claim 3, and
the light source is configured to provide the light emitting element with incident light.

10. The display device of claim 9, wherein the light emitting element comprises a pattern of the quantum dot-polymer composite and the pattern comprises at least one repeating section to emit green light having a maximum emission peak wavelength of about 500 nm to about 550 nm.

11. The display device of claim 10, wherein
the pattern comprises a plurality of light-emitting sections; and
the light source comprises a plurality of light emitting units corresponding to the plurality of light-emitting sections, respectively.

12. The display device of claim 11, wherein the light emitting units comprise a first electrode and a second electrode facing each other and an electroluminescent layer disposed between the first electrode and the second electrode.

13. The display device of claim 12, wherein the light emitting units comprise an organic light emitting diode.

14. The display device of claim 9, wherein the light source comprises at least one of a liquid crystal panel, a light emitting diode and an organic light emitting diode.

15. The display device of claim 9, wherein the light emitting element comprises a sheet of the quantum dot-polymer composite.

16. The display device of claim 9, wherein the incident light has an emission peak wavelength of about 440 nanometers to about 460 nanometers.

17. The display device of claim 9, wherein the display further comprises an optical element that blocks, reflects or absorbs a blue light.

18. A quantum dot, comprising
a core comprising a semiconductor nanocrystal comprising a Group III-V compound; and
a semiconductor nanocrystal shell disposed on the core, the semiconductor nanocrystal shell comprising zinc, selenium, and sulfur,
wherein the quantum dot does not comprise cadmium,
an emission peak wavelength of the quantum dot is in a range of about 500 nanometers to about 550 nanometers,
an ultraviolet-visible absorption spectrum of the quantum dot comprises a first exciton absorption peak having a first peak energy and a second exciton absorption peak having a second peak energy, and
an absolute value of a second derivative of the second peak energy of the second exciton absorption peak is greater than or equal to about 0.001.

19. The quantum dot of claim 18, wherein the absolute value of the second derivative of the second peak energy of the second exciton absorption peak is less than or equal to about 0.0055.

20. A quantum dot, comprising
a core comprising a semiconductor nanocrystal comprising a Group III-V compound; and
a semiconductor nanocrystal shell disposed on the core, the semiconductor nanocrystal shell comprising zinc, selenium, and sulfur,
wherein the quantum dot does not comprise cadmium,
an emission peak wavelength of the quantum dot is in a range of about 500 nanometers to about 550 nanometers,
an ultraviolet-visible absorption spectrum of the quantum dot comprises a first exciton absorption peak and a second exciton absorption peak, and
a difference between an energy of the first exciton absorption peak and an energy of the second exciton absorption peak is greater than or equal to about 0.34 electronvolts.

21. The quantum dot of claim 20, wherein the difference between the energy of the first exciton absorption peak and the energy of the second exciton absorption peak is less than or equal to about 0.5 electronvolts.

22. The quantum dot of claim 21, wherein the ultraviolet-visible absorption spectrum of the quantum dot further comprises a third exciton absorption peak.

23. The quantum dot of claim 22, wherein a difference between the energy of the first exciton absorption peak and an energy of the third exciton absorption peak is greater than or equal to about 0.55 electronvolts.

24. The quantum dot of claim 21, wherein the semiconductor nanocrystal core comprises indium and phosphorus.

25. The quantum dot of claim 24, wherein the semiconductor nanocrystal core further comprises zinc.

* * * * *